(12) United States Patent
Sun et al.

(10) Patent No.: US 12,489,425 B2
(45) Date of Patent: Dec. 2, 2025

(54) SWITCHABLE ACOUSTIC WAVE FILTER

(71) Applicant: Skyworks Solutions, Inc., Irvine, CA (US)

(72) Inventors: Weimin Sun, Santa Rosa Valley, CA (US); Hai H. Ta, San Diego, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 665 days.

(21) Appl. No.: 17/664,729

(22) Filed: May 24, 2022

(65) Prior Publication Data
US 2022/0385272 A1    Dec. 1, 2022

Related U.S. Application Data

(60) Provisional application No. 63/208,620, filed on Jun. 9, 2021, provisional application No. 63/208,600, filed
(Continued)

(51) Int. Cl.
*H03H 9/64* (2006.01)
*H01Q 9/04* (2006.01)
(Continued)

(52) U.S. Cl.
CPC .......... *H03H 9/6406* (2013.01); *H01Q 9/04* (2013.01); *H03H 9/02007* (2013.01); *H03H 9/17* (2013.01); *H03H 9/725* (2013.01)

(58) Field of Classification Search
CPC .... H03H 9/6406; H03H 9/02007; H03H 9/17; H03H 9/725
See application file for complete search history.

(56) References Cited

U.S. PATENT DOCUMENTS 6,525,624 B1   2/2003   Hikita et al.
9,041,484 B2   5/2015   Burgener et al.
(Continued)

FOREIGN PATENT DOCUMENTS

CN   210246743 U   4/2020
JP   2001-160766   6/2001
(Continued)

OTHER PUBLICATIONS

U.S. Appl. No. 17/664,757, filed May 24, 2022, Switchable Acoustic Wave Filter and Related Multiplexers.

*Primary Examiner* — Samuel S Outten
(74) *Attorney, Agent, or Firm* — Knobbe, Martens Olson & Bear, LLP

(57) ABSTRACT

Aspects of this disclosure relate to a switchable acoustic wave filter. The switchable acoustic wave filter can include a switch configured to electrically connect an acoustic wave resonator to a node in a first state and to electrically isolate the acoustic wave resonator from the node in a second state. The switchable acoustic wave filter can filter a radio frequency signal with at least the acoustic wave resonator and a second acoustic wave resonator in the first state. The switchable acoustic wave filter can filter the radio frequency signal with at least the second acoustic wave resonator in the first state. Related multiplexers, radio frequency systems, wireless communication devices, and methods are also disclosed.

20 Claims, 22 Drawing Sheets

Related U.S. Application Data on Jun. 9, 2021, provisional application No. 63/194,760, filed on May 28, 2021.

(51) Int. Cl.
*H03H 9/02* (2006.01)
*H03H 9/17* (2006.01)
*H03H 9/72* (2006.01)

(56) References Cited

U.S. PATENT DOCUMENTS

| | | |
|---|---|---|
| 9,572,052 B2 | 2/2017 | King et al. |
| 10,382,009 B2 | 8/2019 | Nosaka |
| 10,587,292 B2 | 3/2020 | Elbrecht et al. |
| 10,819,310 B2 | 10/2020 | Horita et al. |
| 2009/0201104 A1* | 8/2009 | Ueda .................. H03H 9/6483 333/195 |
| 2013/0154761 A1 | 6/2013 | Ilkov |
| 2018/0019731 A1 | 1/2018 | Tsukamoto et al. |
| 2018/0226946 A1 | 8/2018 | Kim et al. |
| 2018/0367118 A1 | 12/2018 | Jian |
| 2020/0021274 A1* | 1/2020 | Wagner .................. H03H 9/542 |
| 2020/0228097 A1 | 7/2020 | Yasuda |
| 2022/0385273 A1 | 12/2022 | Sun et al. |

FOREIGN PATENT DOCUMENTS

| | | |
|---|---|---|
| JP | 2002-353704 | 12/2002 |
| JP | 2006-304081 | 11/2006 |
| WO | WO 2006/013753 | 2/2006 |

\* cited by examiner

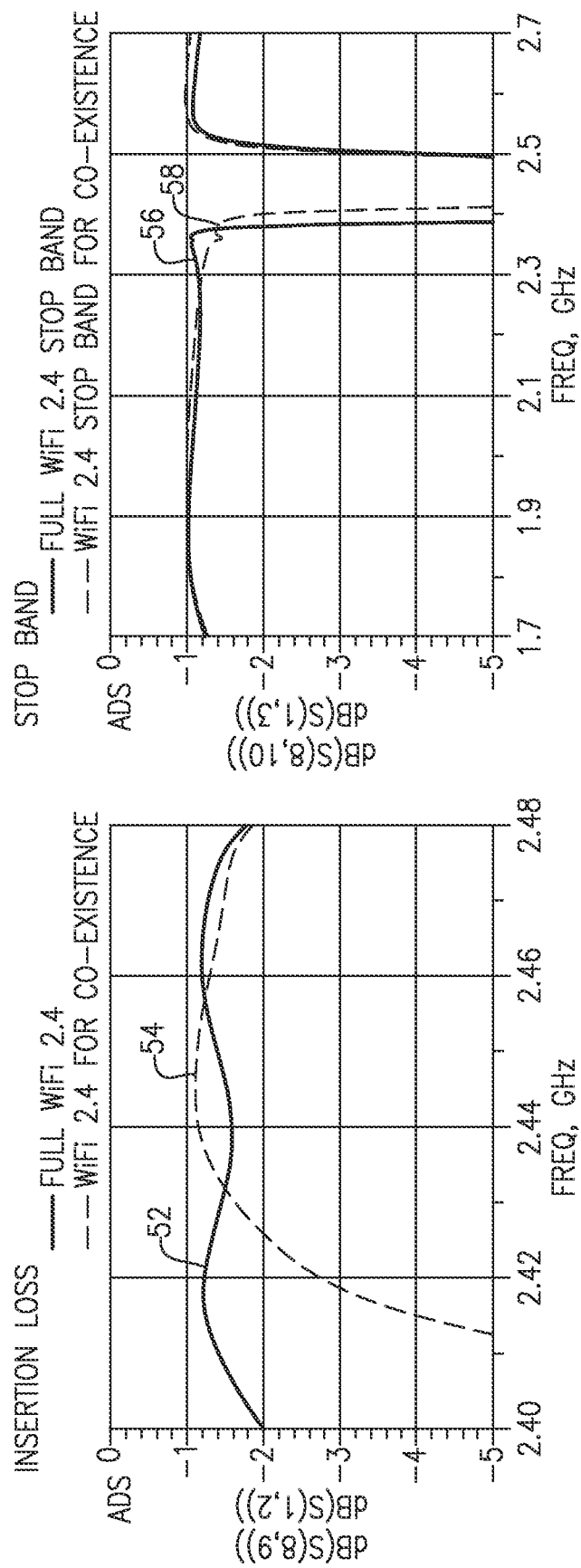

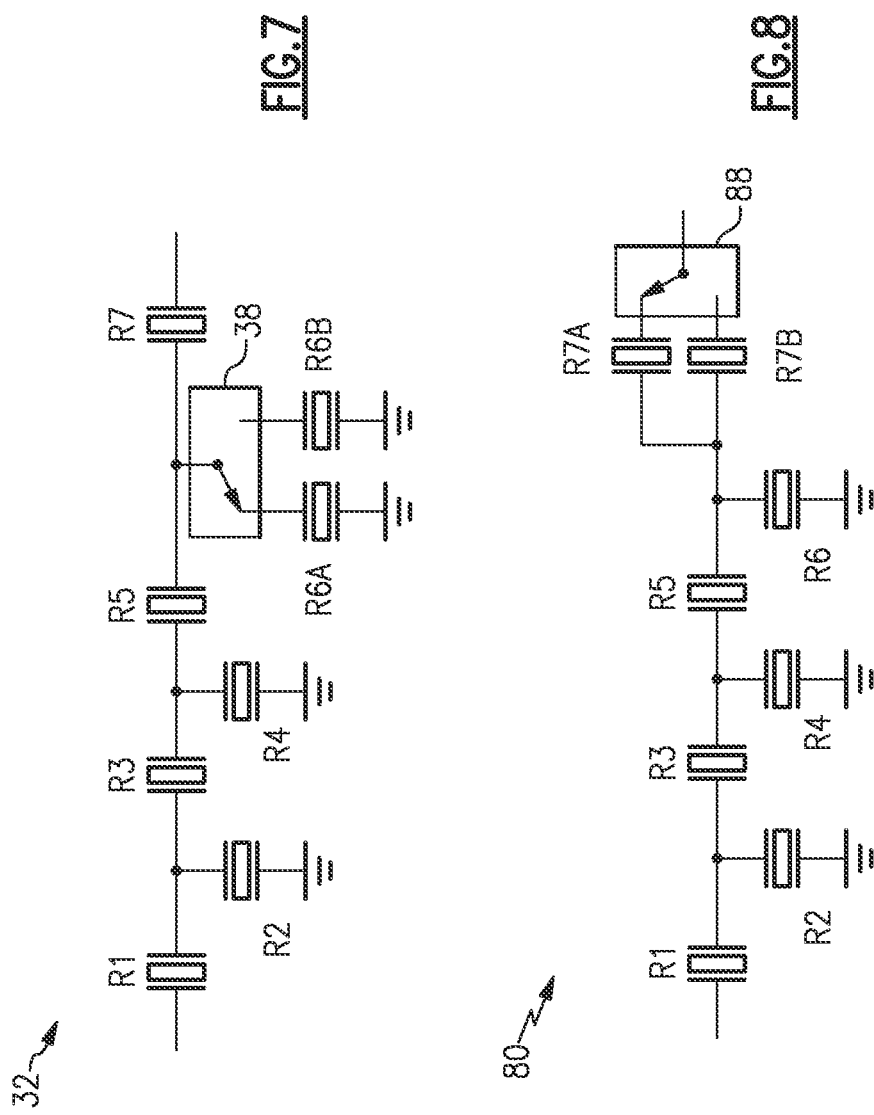

SWITCHABLE ACOUSTIC WAVE FILTER

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/194,760, filed May 28, 2021 and titled "SWITCHABLE ACOUSTIC WAVE FILTER AND RELATED MULTIPLEXERS," U.S. Provisional Application No. 63/208,600, filed Jun. 9, 2021 and titled "SWITCHABLE ACOUSTIC WAVE FILTER," and U.S. Provisional Application No. 63/208,620, filed Jun. 9, 2021 and titled "MULTIPLEXER WITH SWITCHABLE ACOUSTIC WAVE FILTER," the disclosures of each of which are hereby incorporated by reference in their entireties and for all purposes.

BACKGROUND

Technical Field

Embodiments of this disclosure relate to filters that includes acoustic wave resonators.

Description of Related Technology

An acoustic wave filter can include a plurality of acoustic wave resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). SAW filters include SAW resonators. Example SAW resonators include temperature compensated SAW resonators, non-temperature compensated SAW resonators, and multilayer piezoelectric substrate (MPS) SAW resonators.

Acoustic wave filters can be implemented in radio frequency electronic systems. For instance, filters in a radio frequency front end of a mobile phone can include acoustic wave filters. An acoustic wave filter can be a band pass filter or a band stop filter. A plurality of acoustic wave filters can be arranged as a multiplexer. For example, two acoustic wave filters can be arranged as a duplexer. There are technical challenges associated with filtering signals with relatively close frequencies using different filters of a multiplexer. In addition, there are a variety of engineering tradeoffs associated with a filter that filters signals under different conditions.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a switchable acoustic wave filter that includes a first acoustic wave resonator, a second acoustic wave resonator, and a switch configured to electrically connect the first acoustic wave resonator to a node of the switchable acoustic wave filter in a first state and to electrically isolate the first acoustic wave resonator from the node of the switchable acoustic wave filter in a second state. The switchable acoustic wave filter is configured to receive a radio frequency signal, filter the radio frequency signal with at least the first acoustic wave resonator and the second acoustic wave resonator in the first state, and filter the radio frequency signal with at least the second acoustic wave resonator in the second state.

The switchable acoustic wave filter can have a different bandwidth in the first state than in the second state. The switch can electrically connect an electrode of the first acoustic wave resonator to a termination impedance in the second state.

The switchable acoustic wave filter can include a third acoustic wave resonator. The switch can electrically isolate the third acoustic wave resonator from the node in the first state and electrically connect the third acoustic wave resonator to the node in the second state. The first acoustic wave resonator and the third acoustic wave resonator can have different resonant frequencies.

The first acoustic wave resonator can be a series resonator. Alternatively, the first acoustic wave resonator can be a shunt resonator. The first acoustic wave resonator can be a bulk acoustic wave resonator in certain applications.

The switchable acoustic wave filter can be a band pass filter. The switchable acoustic wave filter can be a band stop filter. The switchable acoustic wave filter can be configured to filter a wireless local area network signal. The switchable acoustic wave filter can be configured to filter a cellular signal. The switchable acoustic wave filter can have a single switch loss.

The switchable acoustic wave filter can include a second switch and a fourth acoustic wave resonator. The second switch can electrically connect and electrically isolate the fourth acoustic wave resonator from a second node of the switchable acoustic wave filter in different states.

Another aspect of this disclosure is a multiplexer that includes a switchable acoustic wave filter and a second filter coupled to the switchable acoustic wave filter at a common node. The switchable acoustic wave filter includes a first acoustic wave resonator, a second acoustic wave resonator, and a switch. The switch is configured to electrically connect the first acoustic wave resonator to a node of the switchable acoustic wave filter in a first state and to electrically isolate the first acoustic wave resonator from the node of the switchable acoustic wave filter in a second state. The switchable acoustic wave filter is configured to receive a radio frequency signal, filter the radio frequency signal with at least the first acoustic wave resonator and the second acoustic wave resonator in the first state, and filter the radio frequency signal with at least the second acoustic wave resonator in the second state.

The second filter can be a second switchable acoustic wave filter configured to selectively electrically couple an acoustic wave resonator to a node of the second filter. The multiplexer can include a third filter coupled to the common node.

The switchable acoustic wave filter can have a single switch loss. The second state can be associated with co-existence.

Another aspect of this disclosure is a method of radio frequency filtering. The method includes filtering a radio frequency signal with at least a first acoustic wave resonator and a second acoustic wave resonator of a switchable acoustic wave filter in a first state, a toggling a state of the switchable acoustic wave filter from the first state to a second state, and filtering a radio frequency signal with at least the second acoustic wave resonator of the switchable acoustic wave filter and not with the first acoustic wave resonator in the second state.

The toggling can change a bandwidth of the switchable acoustic wave filter. The switchable acoustic wave filter can have a single switch loss.

Another aspect of this disclosure is a multiplexer with a switchable acoustic wave filter. The multiplexer includes a first filter configured to receive a radio frequency signal and a second filter connected to the first filter at a common node. The first filter includes one or more acoustic wave resonators, switchable acoustic wave resonators, and a switch configurable into at least a first state and a second state. The switch is configured to select a different subset of the switchable acoustic wave resonators to filter the radio frequency signal together with at least the one or more acoustic wave resonators in the first state than in the second state.

The second state can be associated with co-existence. The first filter can have lower performance associated with an operating band for the second state relative to the first state. The first filter can be a band pass filter having a pass band, where the pass band covers a smaller frequency range for the second state relative to the first state. The first filter can be a band stop filter having a stop band, where the stop band covers a smaller frequency range for the second state relative to the first state.

The switchable acoustic wave resonators can include series resonators. The switchable acoustic wave resonators can include shunt resonators.

A band edge of the first filter and a band edge of the second filter can be closer in frequency in the first state of the switch than in the second state of the switch. The first state can be associated with associated with the second filter being inactive and the second state can be associated with co-existence.

The second filter can include a second switch and second switchable acoustic wave resonators. The first filter can be configured to move a band edge of a frequency response of the first filter by toggling the switch between the first state and the second state. The second filter can be configured to move a band edge of a frequency response of the second filter with the second switch. The multiplexer can include an inductor-capacitor circuit coupled between both the first filter and the second filter and an antenna node of the multiplexer. The inductor-capacitor filter can attenuate a harmonic generated by the switch.

The first filter can be a band pass filter and the second filter can be a band stop filter. The first filter can be a band stop filter and the second filter can be a band pass filter. The first filter and the second filter can be band pass filters.

The first filter can have a single switch loss. The first filter can include a second switch and second switchable acoustic wave resonators.

The first filter and the second filter can be configured to filter radio frequency signals associated with different frequency bands. The different frequency bands can include a wireless local area network band and a cellular band.

The first filter and the second filter can have respective band edges that are within 5 megahertz of each other.

The different subsets can include a first subset and a second subset, where the first subset consists of a first switchable acoustic wave resonator and the second subset consists of a second switchable acoustic wave resonator.

Another aspect of this disclosure is a wireless communication that includes an antenna switch, an antenna, and an antenna-plexer. The antenna-plexer including a first filter and a second filter coupled to the first filter at a common node. The first filter is in a signal path between the antenna switch and the antenna, a first filter configured to receive a radio frequency signal, the first filter including one or more acoustic wave resonators, switchable acoustic wave resonators, and a switch configurable into at least a first state and a second state, the switch configured to select a different subset of the switchable acoustic wave resonators to filter the radio frequency signal together with at least the one or more acoustic wave resonators in the first state than in the second state.

Another aspect of this disclosure is a switchable filter that includes one or more acoustic wave resonators, switchable acoustic wave resonators, and a switch configurable into at least a first state and a second state. The switch is configured to select a different subset of the switchable acoustic wave resonators to filter a radio frequency signal together with at least the one or more acoustic wave resonators in the first state than in the second state.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/664,757, titled "SWITCHABLE ACOUSTIC WAVE FILTER AND RELATED MULTIPLEXERS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 5A is a graph of insertion loss for the switchable band pass filter comparing a full pass band and a pass band for accommodating co-existence.

FIG. 5B is graph of a frequency response for a stop band of a switchable band stop filter comparing a full stop band and a stop band for accommodating co-existence.

FIG. 7 is a schematic diagram of a switchable band pass filter according to an embodiment.

FIG. 8 is a schematic diagram of a switchable band pass filter according to another embodiment.

DETAILED DESCRIPTION OF CERTAIN EMBODIMENTS

Figure 1A:
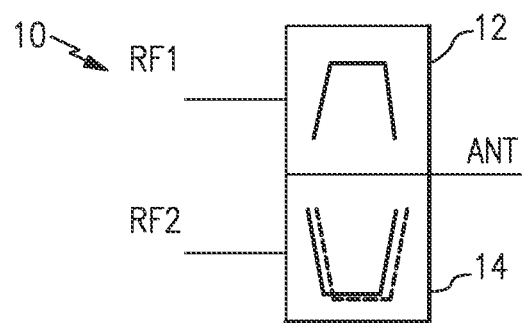
FIGS. 1A, 1B, and 1C are schematic block diagrams of multiplexers according to embodiments.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Antenna-plexers are multiplexers coupled between an antenna and a plurality of radio frequency signal paths. An antenna-plexer can frequency domain multiplex signals having relatively close frequencies in certain applications. An example antenna-plexer can diplex between a mid-high band (MHB) signal and a 2.4 gigahertz (GHz) Wi-Fi signal. The MHB signal can be a Band 40 signal, for example. Since the 2.4 GHz Wi-Fi band has a lower band edge at 2.4 GHz and a Band 40 signal has an upper band edge at 2.4 GHz, performance at the example antenna-plexer can be significantly degraded at and/or around 2.4 GHz due to a zero frequency transition. The antenna-plexer loading loss can be significant around 2.4 GHz in this example.

To avoid such performance degradation, an antenna-plexer can include designs that have better performance for one band and sacrifice performance of another band. For example, in a first design, the antenna-plexer can include a filter with a band edge around 2.36 GHz to cover the MHB up to 2.36 GHz and include another filter to cover a full 2.4 GHz Wi-Fi band from 2.4 GHz to 2.48 GHz. A second design can cover the full MHB range up to 2.4 GHz and compromise the lower band edge for 2.4 GHz Wi-Fi. Since the two deigns have different bandwidths for the MHB path, two different filters can be implemented. In order to support both scenarios of MHB bandwidth coverage, switches can switch between two separate filters as desired. Certain switchable designs involve two switches, one switch at the filter input and one at the filter output. Thus, two switch losses can be added the total filter loss in such designs.

Aspects of this disclosure relate to switching one or more particular acoustic wave resonators to adjust bandwidth of a filter. Such filters can employ acoustic wave resonator characteristics and switch a single acoustic wave resonator or subset of acoustic wave resonators to adjust the bandwidth. Accordingly, such a filter can be implemented with only one switch loss included in the filter total loss. Such a filter can have a single switch loss. In addition, since only a single acoustic wave resonator or subset of acoustic wave resonators are switched, the physical layout and implementation is significantly smaller than solutions with two complete filters. This reduction in physical area can be significant in space-limited user equipment designs, such as cellular phones.

A switchable acoustic wave filter can include a first acoustic wave resonator, a second acoustic wave resonator, and a switch configured to electrically connect the first acoustic wave resonator to a node of the switchable acoustic wave filter in a first state and to electrically isolate the first acoustic wave resonator from the node of the switchable acoustic wave filter in a second state. The switchable filter can receive a radio frequency signal, filter the radio frequency signal with at least the first acoustic wave resonator and the second acoustic wave resonator in the first state, and filter the radio frequency signal with at least the second acoustic wave resonator in the second state. The switch can also electrically isolate a third acoustic wave resonator from the node in the first state and electrically connect the third acoustic wave resonator to the node in the second state. Accordingly, the switch can select either the first acoustic wave resonator or the third acoustic wave resonator to filter a radio frequency signal in different states.

Switchable filters disclosed herein can be implemented in multiplexers, such as antenna-plexers. One or more filters of a multiplexer can be switchable to adjust bandwidth. Bandwidth can be adjusted by switching in one or more acoustic wave resonators.

When two filters of a multiplexer have band edges that are relatively close to each other in the frequency domain, implementing at least one of the two filters as a switchable filter can create separation between the band edges of the two filters for co-existence and maintain full bandwidth for at least one of the two filters without co-existence. This can sacrifice performance for co-existence and otherwise achieve high filter performance. Band edges of the two filters can be closer in frequency to each other without co-existence for switchable filters disclosed herein than for co-existence. Switchable acoustic wave filters disclosed herein can selectively electrically couple acoustic wave resonator(s) in the filter to adjust performance for coexistence and without co-existence.

A multiplexer can include a switchable acoustic wave filter. The multiplexer can include a first filter and a second filter connected to the first filter at a common node. The first filter can include one or more acoustic wave resonators, switchable acoustic wave resonators, and a switch configurable into at least a first state and a second state. The switch can select a different subset of the switchable acoustic wave resonators to filter the radio frequency signal together with at least the one or more acoustic wave resonators in the first state than in the second state. Selecting the different subsets of switchable acoustic wave resonators can move a band edge of the first filter in the frequency domain. As an example, the different subsets can include a first subset and a second subset, where the first subset includes only a first switchable acoustic wave resonator and the second subset includes only a second switchable acoustic wave resonator. The second filter can also be switchable in certain applications. In certain applications, the switchable acoustic wave filter can be a band pass filter. In some other applications, the switchable acoustic wave filter can be a band stop filter.

Embodiments disclosed herein can achieve technical advantages over other filters and multiplexers. Embodiments disclosed herein can achieve reduced filter switching loss. Certain switchable filters disclosed herein can have a single switch loss. Embodiments disclosed herein can be implemented with a simpler architecture and fewer acoustic wave resonators than using separate filters for different conditions. This can advantageously lead to smaller physical layout and lower cost.

Figure 1B:
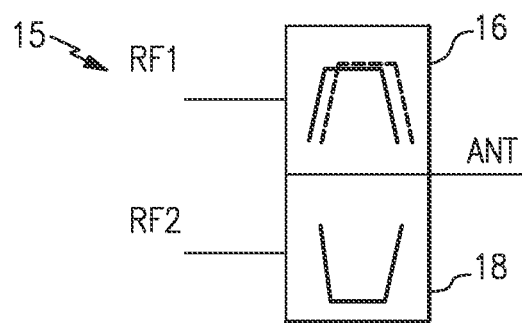
Figure 1C:
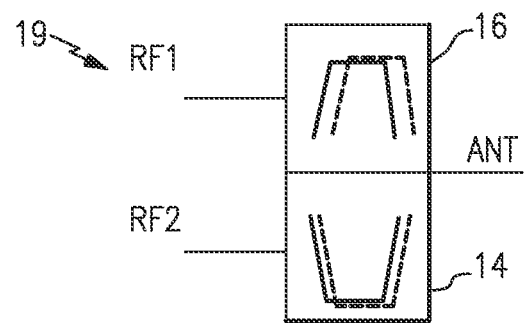

FIGS. 1A, 1B, and 1C are schematic block diagrams of multiplexers according to embodiments. These multiplexers can include two acoustic wave filters. One of these acoustic wave filters is a band pass filter and the other of the acoustic wave filters is a band stop filter. One or both of these acoustic wave filters can be switchable. The example multiplexers illustrated in FIGS. 1A, 1B, and 1C are diplexers.

FIG. 1A illustrates a multiplexer 10 that includes a band pass filter 12 and a switchable band stop filter 14. The band pass filter 12 and the switchable band stop filter 14 can both be acoustic wave filters. The band pass filter 12 can filter a first radio frequency (RF) signal propagating between a first RF node RF1 and an antenna node ANT. The antenna node ANT is a common node of the multiplexer 10 at which the band pass filter 12 and the switchable band stop filter are connected to each other. The first RF signal can be a Wi-Fi signal, such as a 2.4 GHz Wi-Fi signal. A Wi-Fi signal is an example of a wireless local area network (WLAN) signal.

The switchable band stop filter 14 can filter a second RF propagating between a second RF node RF2 and the antenna node ANT. The second RF signal can be within a cellular operating band. The switchable band stop filter 14 can block frequency components generally corresponding to the pass band of the band pass filter 12. Signals propagating between the second RF node RF2 and the antenna node ANT can be mid-high band (MHB) signals. The switchable band stop filter 14 can provide a stop band in a pass band for a band pass filter, such as a 2.4 GHz Wi-Fi stop band within a MHB band pass filter.

The switchable band stop filter 14 is operable in a first state and a second state. In the first state, the switchable band stop filter 14 can have a stop band corresponding to the full pass band of the band pass filter 12. In the second state, the switchable band stop filter 14 can have a stop band where a lower band edge of the stop band is below the lower edge of the pass band of the band pass filter 12. The switchable band stop filter 14 can move a lower edge of the stop band away from the lower edge of the pass band of the band pass filter 12 for the second state relative to the first state. In the first state, the band pass filter 12 can be inactive and not filtering a radio frequency signal. The second state can be for co-existence.

FIG. 1B illustrates a multiplexer 15 that includes a switchable band pass filter 16 and a band stop filter 18. The switchable band pass filter 16 and a band stop filter 18 can both be acoustic wave filters. The switchable band pass filter 16 is operable in a first state and a second state. In the first state, the switchable band pass filter 16 can have a pass band corresponding to a full operating band. In the second state, the switchable pass stop filter 16 can have a pass band where a lower band edge of the stop band is above the lower end of the operating band. The switchable band pass filter 12 can move a lower edge of the stop band away from the lower edge of the stop band of the band stop filter 18 for the second state relative to the first state. In the first state, the band stop filter 18 can be inactive and not filtering a radio frequency signal. The second state can be for co-existence. The band stop 18 can have a stop band that generally corresponds to the pass band of the operating band associated with the switchable band pass filter 16.

FIG. 1C illustrates a multiplexer 19 that includes a switchable band pass filter 16 and a switchable band stop filter 14. In the multiplexer 19, both the band pass filter and the band stop filter are switchable. For co-existence, the switchable band pass filter 16 can move an edge of its pass band and the switchable band stop filter 14 can move an edge of its stop band. In co-existence, the switchable band pass filter 16 can reduce its pass band and the switchable band stop filter 14 can reduce its stop band in the multiplexer 19. Without co-existence, the switchable band pass filter 16 can have a full pass band and the switchable band stop filter 14 can have a full stop band.

The band stop filters of FIGS. 1A, 1B, and 1C, can provide a stop band in a larger pass band of a band pass filter, a low pass filter, or a high pass filter. As one example, the band stop filters of FIGS. 1A, 1B, and 1C can provide a 2.4 GHz Wi-Fi stop band in a band pass filter for passing MHB signals.

Although the multiplexers of FIGS. 1A, 1B, and 1C each include band pass filter and a band stop filter, any suitable principles and advantages of these embodiments can be applied to a multiplexer with a plurality of band pass filters and/or a multiplexer with a plurality band stop filters.

Although moving certain band edges of filters are discussed with reference to FIGS. 1A to 1C, any suitable principles and advantages disclosed here can be applied to any band edge of an acoustic wave filter or to two or more band edges of an acoustic wave filter.

Examples of the multiplexers of FIGS. 1A, 1B, and 1C will be discussed with reference to FIGS. 2, 3, and 4, respectively.

Figure 2:
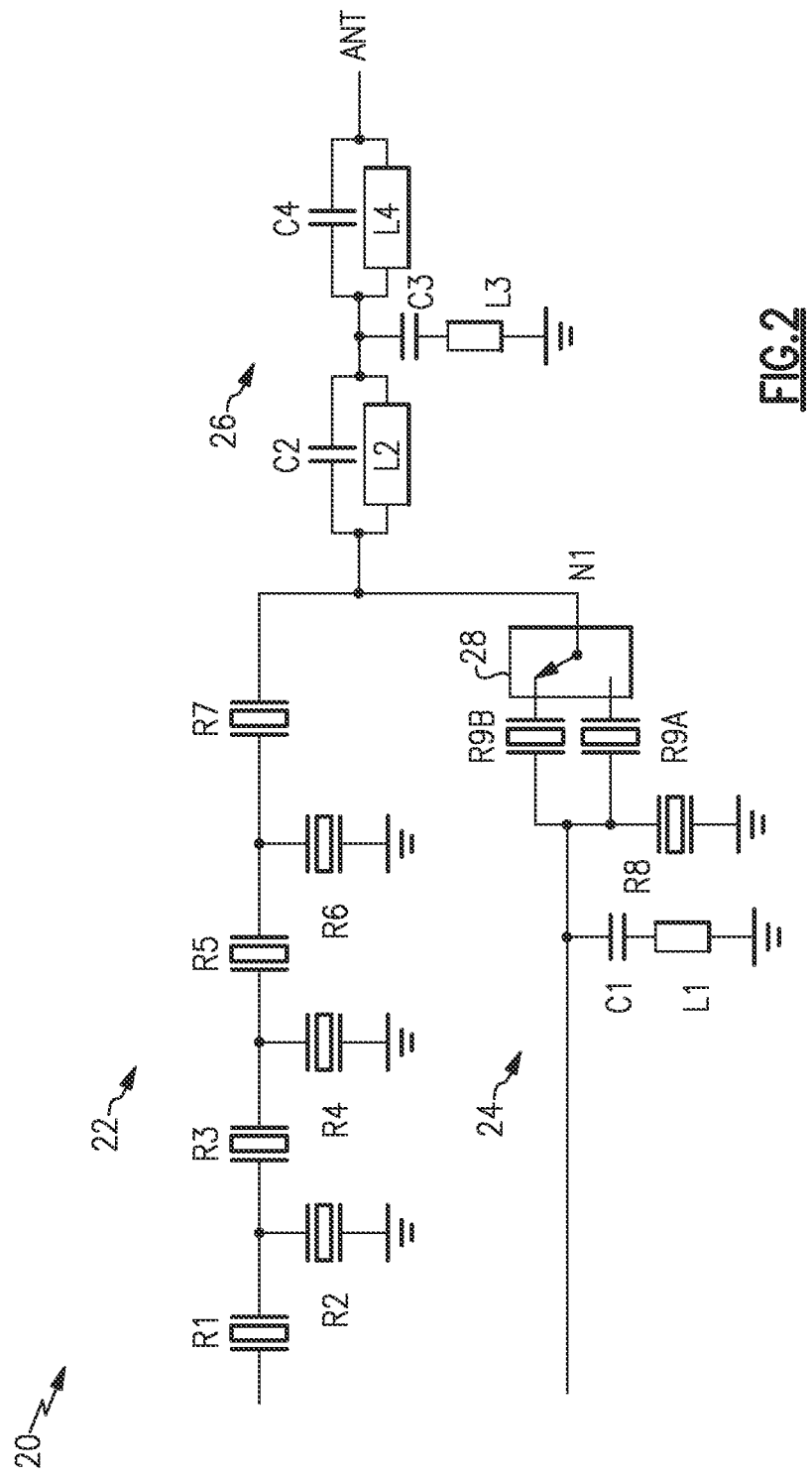
FIG. 2 is a schematic diagram of a multiplexer with a switchable band stop filter according to an embodiment.

FIG. 2 is a schematic diagram of a multiplexer 20 with a band pass filter 22 and a switchable band stop filter 24 according to an embodiment. The multiplexer 20 is an example of the multiplexer 10 of FIG. 1A. The illustrated multiplexer 20 is a diplexer. The multiplexer 20 includes the band pass filter 22, the switchable band stop filter 24, and a passive impedance network 26.

The band pass filter 22 includes acoustic wave resonators R1, R2, R3, R4, R5, R6, and R7. These acoustic wave resonators can include one or more surface acoustic wave (SAW) resonators, one or more bulk acoustic wave (BAW) resonators, one or more other acoustic wave resonators, or any suitable combination thereof. As one example, acoustic wave resonators R1 to R7 can be BAW resonators. The band pass filter 22 can have a pass band for passing a 2.4 GHz Wi-Fi signal, for example. The operating band for 2.4 GHz Wi-Fi can be from 2.40 GHz to 2.48 GHz.

As illustrated, the switchable band stop filter 24 includes a capacitor C1, an inductor L1, acoustic wave resonators R8, R9A, R9B, and a switch 28. The acoustic wave resonators R8, R9A, R9B can include one or more SAW resonators, one or more BAW resonators, one or more other acoustic wave resonators, or any suitable combination thereof. As one example, acoustic wave resonators R8, R9A, R9B can be BAW resonators. The acoustic wave resonators R9A, R9B are switchable acoustic wave resonators in the multiplexer 20.

The switch 28 selects between series acoustic wave resonators R9A and R9B to include in the group of acoustic wave resonators of the switchable band stop filter 24 that filter an RF signal. In a first state, the switch 28 can electrically connect a first series acoustic wave resonator R9A to node N1 of the switchable band stop filter 24. The switch 28 can also electrically isolate a second series acoustic wave resonator R9B from the node N1 in the first state. The acoustic wave resonators R8 and R9A filter an RF signal in the first state. The acoustic wave resonator R9B does not filter the RF signal in the first state.

In a second state, the switch 28 can electrically connect the second series acoustic wave resonator R9B to the node N1. The switch 28 can also electrically isolate the first series acoustic wave resonator R9A from the node N1 in the second state. The acoustic wave resonators R8 and R9B filter an RF signal in the second state. The acoustic wave resonator R9A does not filter the RF signal in the second state. As illustrated, the switchable band stop filter 24 is in second state.

In certain applications, the switch 28 can electrically connect both series acoustic wave resonators R9A and R9B to the node N1 in a third state.

The series acoustic wave resonators R9A and R9B can one or more different characteristics than each other. The one or more different characteristics of the series acoustic wave resonators R9A and R9B can include one or more of resonant frequency, anti-resonant frequency, quality factor (Q), harmonic distortion, linearity, temperature coefficient of frequency (TCF), power handling, or the like.

The series acoustic wave resonators R9A and R9B can have different resonant frequencies than each other. Accordingly, by toggling between the first state and the second state, the switch 28 can adjust the bandwidth of the switchable band stop filter 24. In the first state, the switchable band stop filter 24 can have a stop band corresponding to a full operating band associated with the band pass filter 22. In the second state, a lower band edge of the stop band of the switchable band stop filter 24 can be moved to a higher frequency relative to for the first state. This can sacrifice some of the stop band corresponding to the operating band associated with a radio frequency signal filtered by the band pass filter. In the second state, the switchable band stop filter 24 can have a reduced stop band. The second state can be for co-existence.

The passive impedance network 26 includes capacitors C2, C3, C4 and inductors L2, L2, and L4. The passive impedance network is coupled between each of the filters 22 and 24 and the antenna node ANT. The antenna node ANT is a common node of the multiplexer 20 at which the band pass filter 22 and the switchable band stop filter 24 are connected to each other. The passive impedance network 26 can provide filtering and/or impedance transformation.

The passive impedance network 26 can implement an inductor-capacitor (LC) filter. The LC filter can attenuate one or more harmonics generated by a switch of a switchable filter. Accordingly, the one or more harmonics can be suppressed at the antenna node ANT. In some instances, the LC filter can attenuate harmonics of a plurality of switches of a multiplexer. The LC filter can provide low pass filtering to protect a switch and/or acoustic wave resonators of a multiplexer from one or more relatively high power blocker signals. The passive impedance network 26 can contribute to meeting an inter-modulation specification. The passive impedance network 26 can filter out inter-modulation distortion and/or one or more spurious signals. The passive impedance network 26 can be implemented by any suitable inductor-capacitor circuit topology for a particular application.

Multiplexers in accordance with any suitable principles and advantages disclosed herein can be implemented without the passive impedance network 26 in various applications. Accordingly, a multiplexer with at least one switchable filter in accordance with any suitable principles and advantages disclosed herein can be implemented without an LC filter coupled between the switchable filter and a common node or antenna node of the multiplexer.

Figure 3:
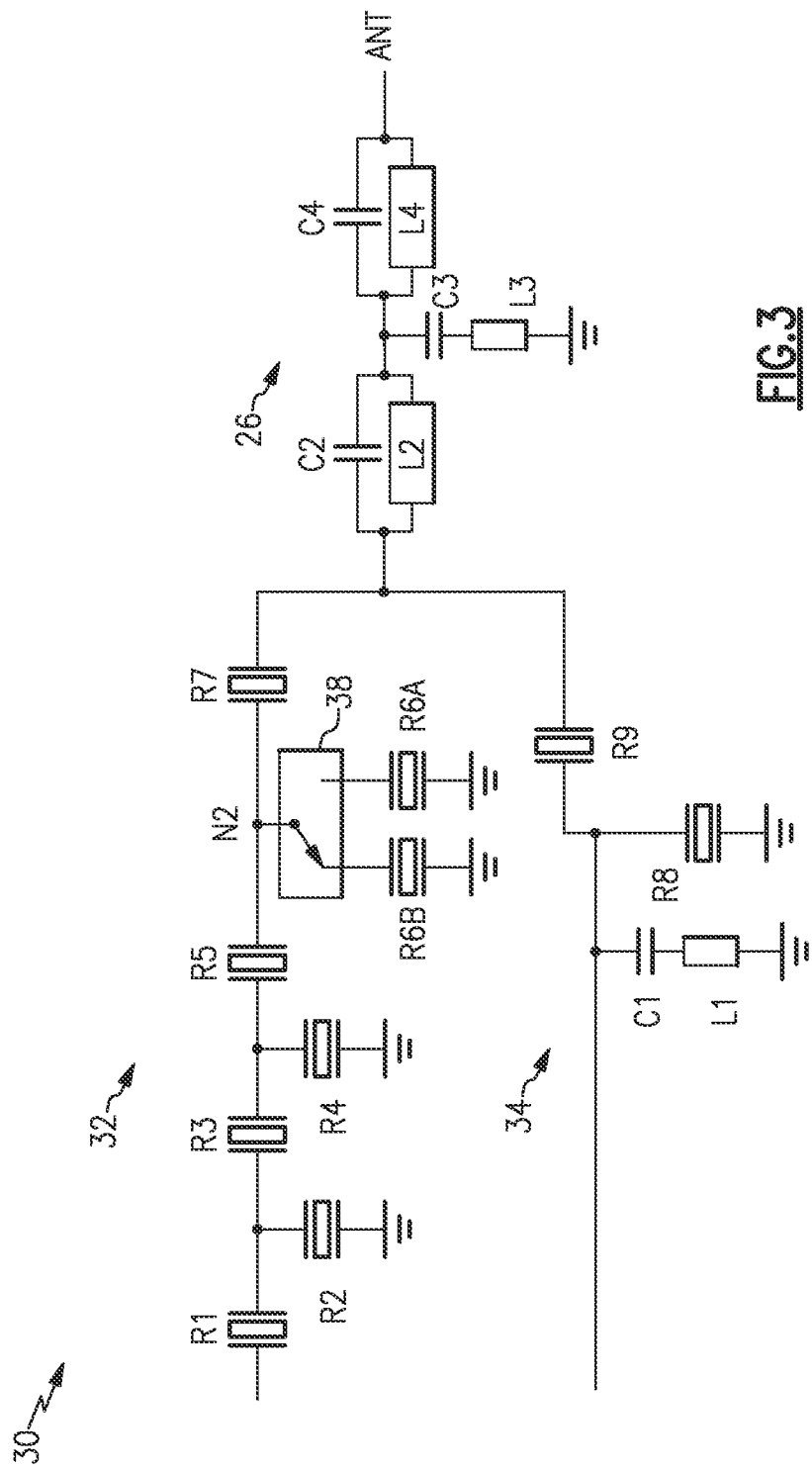
FIG. 3 is a schematic diagram of a multiplexer with a switchable band pass filter according to an embodiment.

FIG. 3 is a schematic diagram of a multiplexer with a switchable band pass filter 32 and a band stop filter 34 according to an embodiment. The multiplexer 30 is an example of the multiplexer 15 of FIG. 1A. The illustrated multiplexer 30 is a diplexer. The multiplexer 30 includes the switchable band pass filter 32, the band stop filter 34, and a passive impedance network 26.

The switchable band pass filter 32 includes acoustic wave resonators R1, R2, R3, R4, R5, R6A, R6B, and R7 and switch 38. The switchable band pass filter 32 is like the band pass filter 22 of FIG. 2, except that the switchable band pass filter 32 includes the switch 38 that can selectively electrically connect shunt resonators R6A and/or R6B to node N2. The shunt acoustic wave resonators R6A and R6B are switchable acoustic wave resonators in the multiplexer 30.

The shunt acoustic wave resonators R6A and R6B can one or more different characteristics than each other. The one or more different characteristics of the shunt acoustic wave resonators R6A and R6B can include one or more of anti-resonant frequency, resonant frequency, quality factor, harmonic distortion, linearity, TCF, power handling, or the like. For example, the shunt resonators R6A and R6B can have different resonant frequencies. Changing the state of the switch 38 can adjust the lower edge of the pass band of the switchable band pass filter 32.

The switch 38 selects which shunt acoustic wave resonator(s) R6A and/or R6B to include in the group of acoustic wave resonators of the switchable band pass filter 32 that filter an RF signal. In a first state, the switch 38 can electrically connect a first shunt acoustic wave resonator R6A to node N2 of the switchable band pass filter 32. The switch 38 can also electrically isolate a second shunt acoustic wave resonator R6B from the node N2 in the first state. The acoustic wave resonators R1 to R5, R6A, and R7 filter an RF signal in the first state. The acoustic wave resonator R6B does not filter the RF signal in the first state.

In a second state, the switch 38 can electrically connect the second shunt acoustic wave resonator R6B to the node N2. The switch 38 can also electrically isolate the first shunt acoustic wave resonator R6A from the node N2 in the second state. The acoustic wave resonators R1 to R5, R6B, and R7 filter an RF signal in the second state. The acoustic wave resonator R6A does not filter the RF signal in the second state. In the second state, a lower band edge of the switchable band pass filter 32 can be at a higher frequency than in the first state. This can sacrifice performance at a lower part of the pass band for the second state relative to the first state. Conversely, in the first state, the pass band of the switchable band pass filter 32 can correspond to a full operating band. The second state can be for co-existence. As illustrated, the switchable band pass filter 32 is in the second state.

In certain applications, the switch 38 can electrically connect both shunt acoustic wave resonators R6A and R6B to the node N2 in a third state.

The band stop filter 34 is like the switchable band stop filter 24 of FIG. 2, except that the band stop filter 34 is not switchable. Accordingly, the stop band of the band stop filter 34 can be substantially fixed. In the band stop filter 34, series acoustic wave resonator R9 is included in place of the series acoustic wave resonators R9A and R9B and switch 28 from the switchable band stop filter 24.

Figure 4:
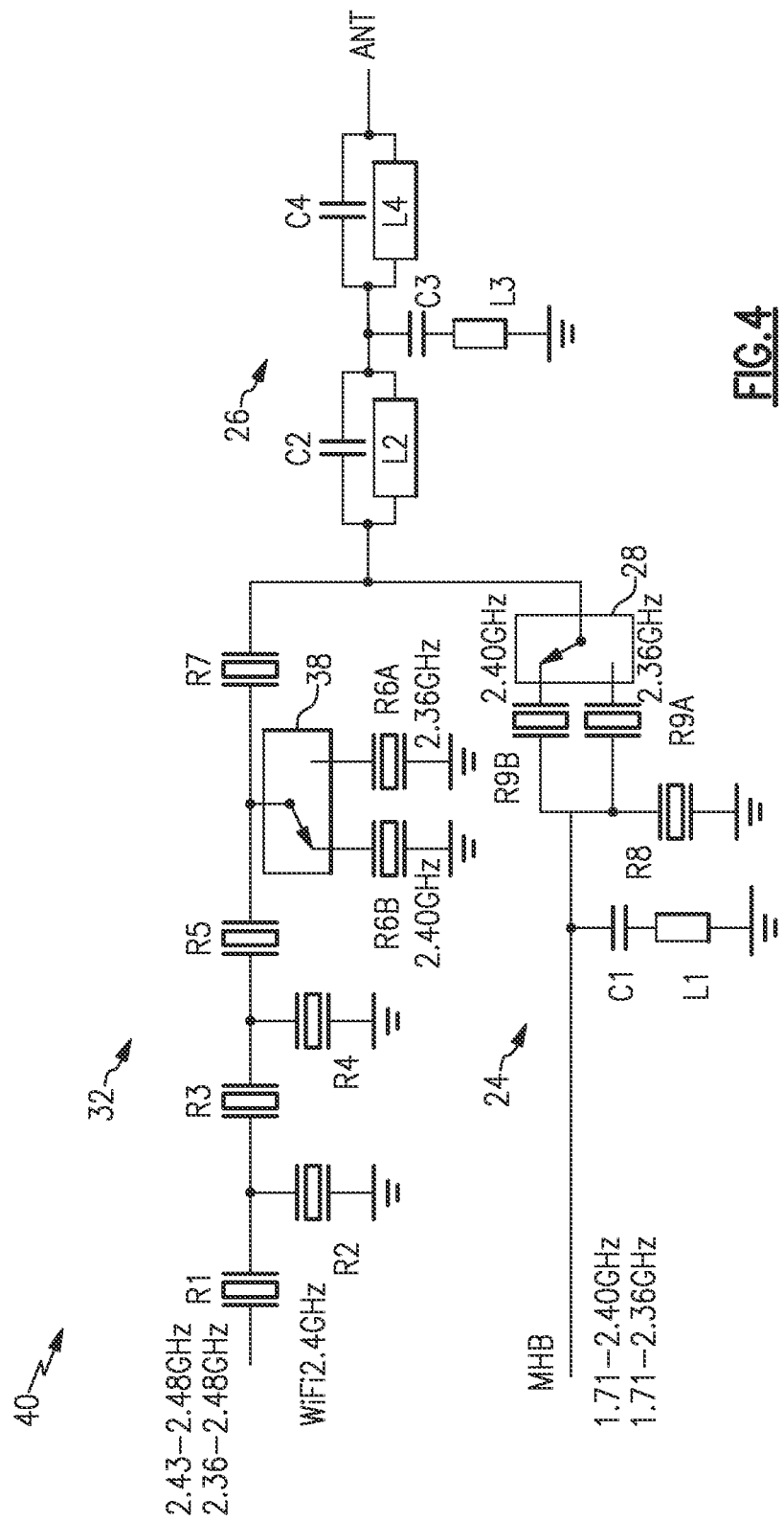
FIG. 4 is a schematic diagram of a multiplexer with a switchable band stop filter and a switchable band pass filter according to an embodiment.

FIG. 4 is a schematic diagram of a multiplexer 40 with a switchable band stop filter 24 and a switchable band pass filter 32 according to an embodiment. In the multiplexer 40, both the band pass filter 32 and the band stop filter 24 are switchable. With the multiplexer 40, performance can be reduced for the switchable band stop filter 24 and/or for the switchable band pass filter 32 in co-existence.

In an example application, the switchable band pass filter 32 is a 2.4 GHz Wi-Fi filter and the switchable band stop filter 24 is a band stop filter blocking 2.4 GHz Wi-Fi for a MHB filter. In the switchable band pass filter 32, the shunt acoustic wave resonator R6A can have a resonant frequency that will support a 2.4 GHz Wi-Fi pass band lower edge of 2.36 GHz and the shunt acoustic wave resonator R6B can have a resonant frequency that will support a 2.4 GHz Wi-Fi pass band lower edge of 2.40 GHz in the example application. In this example, when the shunt acoustic wave resonator R6A is selected, the pass band of the switchable band pass filter 32 can be from 2.36 GHz to 2.48 GHz. When the shunt acoustic wave resonator R6B is selected, the pass band of the switchable band pass filter 32 can be from 2.43 GHz to 2.48 GHz or from 2.40 GHz to 2.48 GHz. Accordingly, selecting the shunt acoustic wave resonator R6B instead of the shunt acoustic wave resonator R6A can move the lower edge of the pass band up in frequency and sacrifice performance for the lower part of the pass band of the switchable band pass filter 32. This performance sacrifice can be made for co-existence, while the larger pass band can otherwise be used.

In the switchable band stop filter 24, the series acoustic wave resonator R9A can have an anti-resonant frequency that will support a 2.4 GHz Wi-Fi 2.4 stop band edge of 2.36 GHz and the series acoustic wave resonator R9B can have an anti-resonant frequency that will support a 2.4 GHz Wi-Fi stop band edge of 2.40 GHz in the example application. In this example, the switch 28 toggling state and adjust a stop band of the switchable band stop filter 24 from 2.36 GHz to 2.48 GHz to 2.40 GHz to 2.48 GHz. A pass band of a filter that includes the switchable band stop filter 24 can adjust from 1.71 GHz to 2.36 GHz to 1.71 GHz to 2.40 GHz.

In certain instances, only one of the switchable band stop filter 24 or the switchable band pass filter 32 can move its band edge by the respective switch 28 or 38 adjusting state. In some instances, the switchable band stop filter 24 and the switchable band pass filter 32 can move band edges away from each other by the switches 28 and 38 adjusting state.

In some instances, the switchable band stop filter 24 and the switchable band pass filter 32 can shift band edges in the same direction in frequency to maintain the same or a similar frequency separation from each other by the switches 28 and 38 adjusting state.

The multiplexer 40 was simulated in two different states. In a first state, a full 2.4 GHz Wi-Fi pass band is provided for a band pass filter and a corresponding stop band is also provided for another filter. In a second state, the pass band and stop band are adjusted for co-existence. FIG. 5A is a graph of insertion loss for the switchable band pass filter 32 for the first state and the second state. FIG. 5B is a graph of that shows a stop band associated with the switchable band stop filter 24 for the first state and the second state.

FIG. 5A is a graph of insertion loss for the switchable band pass filter 32 comparing a full pass band and a pass band for accommodating co-existence. FIG. 5A plots simulation results for insertion loss for a 2.4 GHz Wi-Fi band. A first curve 52 corresponds to insertion loss for a full 2.4 GHz Wi-Fi band for the first state. A second curve 54 corresponds to insertion loss for 2.4 GHz Wi-Fi band for co-existence in the second state. FIG. 5A indicates that insertion loss is sacrificed at the lower end of the 2.4 GHz Wi-Fi band for co-existence in the second state. The pass band of the switchable band pass filter 32 can be reduced at the lower end of the 2.4 GHz Wi-Fi band for co-existence in the second state.

FIG. 5B is graph of a frequency response for a stop band of the switchable band stop filter 24 comparing a full stop band and a stop band for accommodating co-existence. A first curve 56 corresponds to a frequency response with a stop band for a full 2.4 GHz Wi-Fi band for the first state. A second curve 58 corresponds to a frequency response with a smaller stop band for a 2.4 GHz Wi-Fi band for co-existence in the second state. FIG. 5B indicates that a lower end of the 2.4 GHz Wi-Fi stop band is sacrificed for co-existence in the second state.

Figure 6B:
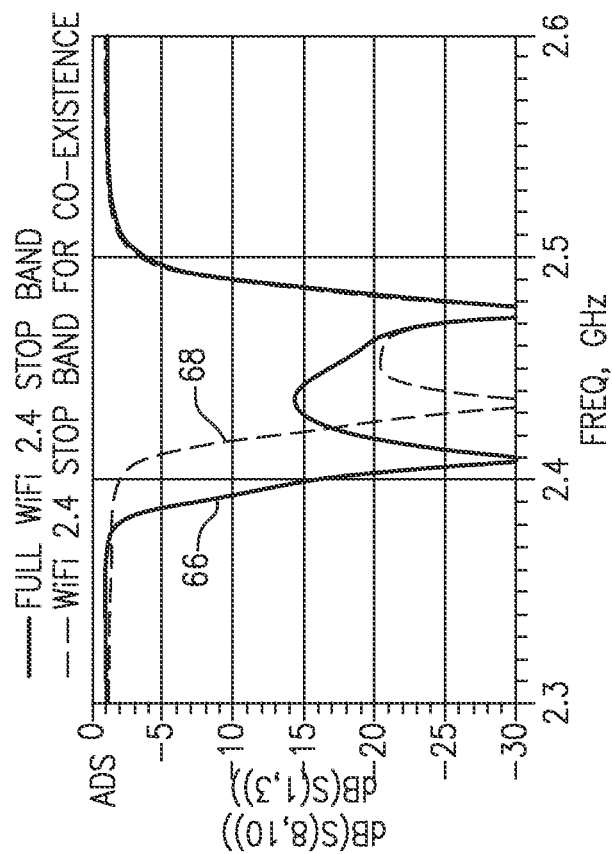
FIG. 6B is graph of a zoomed in frequency response of a switchable band pass filter for a stop band comparing a full stop band and a stop band for accommodating co-existence.
Figure 6A:
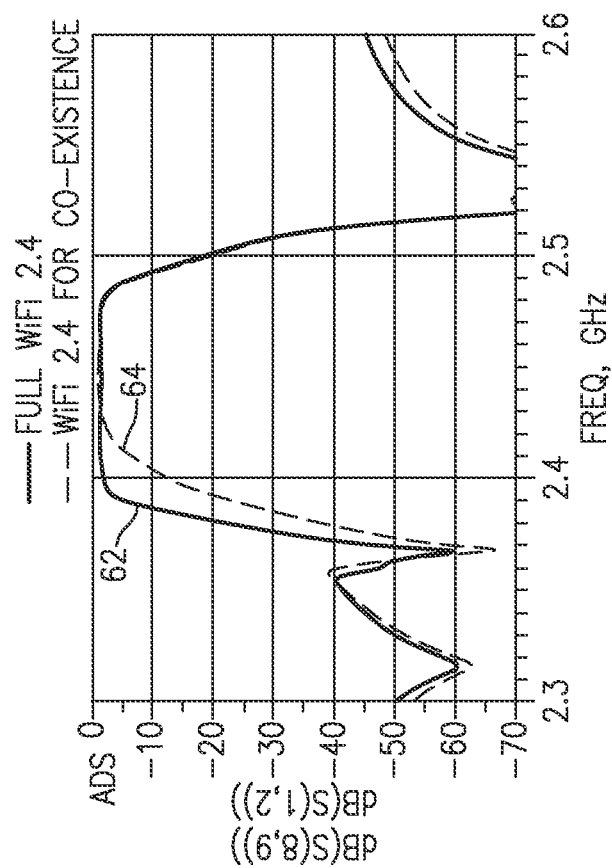
FIG. 6A is a graph of a frequency response of the switchable band pass filter comparing a full pass band and a pass band for accommodating co-existence.

FIG. 6A is a graph of a frequency response of the switchable band pass filter 32 comparing a full pass band and a pass band for accommodating co-existence. A first curve 62 is for a full 2.4 GHz Wi-Fi pass band for the first state. A second curve 64 is for a reduced 2.4 GHz Wi-Fi band for co-existence in the second state. The switch 38 selecting a different shunt acoustic wave resonator R6A or R6B can cause the state of the switchable band pass filter 32 to toggle between the first state and the second state. The simulation results indicate that a lower band edge of the pass band moves up in frequency for the second state. The simulation results indicate that performance in the second state at lower band edge and lower part of the 2.4 GHz Wi-Fi pass band is sacrificed for the second state compared to the first state. In the graph of FIG. 6A, the pass band is from about 2.4 GHz to 2.48 GHz in the first state and from about 2.43 GHz to 2.48 GHz in the second state.

FIG. 6B is graph of a zoomed in frequency response of the switchable band pass filter 24 for a stop band comparing a full stop band and a stop band for accommodating co-existence. A first curve 66 is for a full 2.4 GHz Wi-Fi stop band for the first state. A second curve 68 is for a reduced 2.4 GHz Wi-Fi stop band for co-existence in the second state. The switch 28 selecting a different shunt acoustic wave resonator R9A or R9B can cause the state of the switchable band stop filter 28 to toggle between the first state and the second state. The simulation results indicate that a lower band edge of the stop band moves to a higher frequency for the second state compared to the first state. The simulation results indicate that performance in the second state at part of a stop band is sacrificed for the second state compared to the first state.

Figure 9:
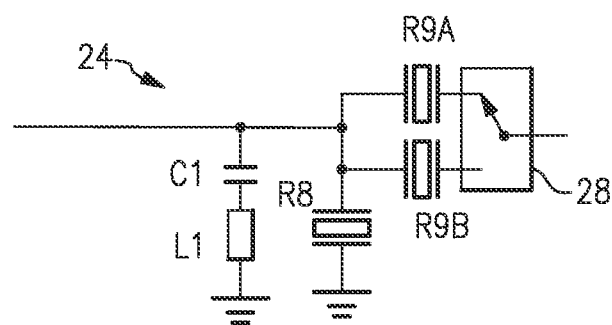
FIG. 9 is a schematic diagram of a switchable band stop filter according to an embodiment.
Figure 10:
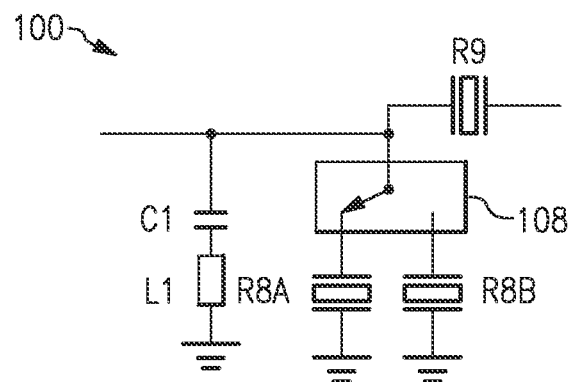
FIG. 10 is a schematic diagram of a switchable band stop filter according to another embodiment.

Any suitable principles and advantages of the switchable filters disclosed herein can be implemented in standalone filters and/or or any other suitable multiplexers. FIGS. 7 and 8 illustrate examples of switchable band pass filters. FIGS. 9 and 10 illustrate examples of switchable band stop filters. In these filters, any suitable acoustic wave resonators can be implemented. As an example, BAW resonators can be included in any of the filters of FIGS. 7 to 10. The example filters of FIGS. 7 to 10 are arranged to adjust one band edge in a frequency domain. Any suitable principles and advantages disclosed herein can be implemented to adjust two or mode band edges in a frequency domain. For example, a band pass filter can include features of FIGS. 7 and 8 to adjust two edges of a pass band. As another example, a band stop filter can include features of FIGS. 9 and 10 to adjust two edges of a stop band. A filter can include any suitable combination of features of the embodiments of FIGS. 7 to 10.

One or more switchable filters in accordance with any suitable principles and advantages disclosed herein can be configured to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. One or more filters in accordance with any suitable principles and advantages disclosed herein can be included in a filter configured to filter a radio frequency signal in a fourth generation (4G) Long Term Evolution (LTE) operating band. One or more filters in accordance with any suitable principles and advantages disclosed herein can be included in a filter having a pass band that includes a 4G LTE operating band and a 5G NR operating band. One or more switchable filters in accordance with any suitable principles and advantages disclosed herein can be configured to filter a radio frequency signal in a wireless local area network band, such as a Wi-Fi band. One or more switchable filters in accordance with any suitable principles and advantages disclosed herein can have a pass band corresponding to a 5G NR operating band, a 4G LTE operating band, a 4G LTE operating band and a 5G operating band, or a wireless local area network operating band. One or more switchable filters in accordance with any suitable principles and advantages disclosed herein can have a stop band corresponding to a 5G NR operating band, a 4G LTE operating band, a 4G LTE operating band and a 5G operating band, or a wireless local area network operating band.

Certain embodiments may be discussed with reference to switching acoustic wave resonators to adjust bandwidth of a filter and/or location of a band edge of the filter in a frequency domain. Any suitable principles and advantages disclosed herein can be applied to switching acoustic wave resonators to adjust one or more other suitable characteristic of a filter, such as one or more of linearity, harmonic distortion, power handling, or the like. For instance, acoustic wave resonators with different linearity characteristics can be switched in and/or out of a filter to achieve different linearity performance in different states. As another example, acoustic wave resonators with different characteristics can be switched in and/or out of a filter to achieve different power handling performance in different states.

FIG. 7 is a schematic diagram of a switchable band pass filter 32 according to an embodiment. The switchable band pass filter 32 has switchable shunt acoustic wave resonators R6A and R6B. In a band pass filter, shunt acoustic wave resonators typically impact a lower edge of a pass band. The switch 38 can select shunt acoustic wave resonator R6A in a first state and select shunt acoustic wave resonator R6B in a second state. This can adjust the lower edge of the pass band for the different states of the switchable band pass filter 32. The series acoustic wave resonator R7 can be a first acoustic wave resonator of the switchable band pass filter 32 from a common node of a multiplexer, for example, as shown in FIGS. 3 and 4. Alternatively, the series acoustic wave resonator R1 can be a first acoustic wave resonator of the switchable band pass filter 32 from a common node of a multiplexer for some other applications. With the series acoustic wave resonator R1 as the first acoustic wave resonator from a common node of a multiplexer, any noise and/or distortion from the switch 38 can be further from the common node. In some instances, the switch 38 can select both shunt acoustic wave resonators R6A and R6B in a third state. In the switchable band pass filter 32, there is only a single switch loss.

FIG. 8 is a schematic diagram of a switchable band pass filter 80 according to another embodiment. The switchable band pass filter 80 has switchable series acoustic wave resonators R7A and R7B. In a band pass filter, series acoustic wave resonators typically impact an upper edge of a pass band. A switch 88 can select series acoustic wave resonator R7A in one state and select series acoustic wave resonator R7B in another state. This can adjust the upper edge of the pass band for different states of the switchable band pass filter 80. For example, the switchable band pass filter 80 can lower the upper band edge of a pass band for co-existence with another frequency band above the pass band. The series acoustic wave resonator R7A and/or R7B can be a first acoustic wave resonator of the switchable band pass filter 80 from a common node of a multiplexer. Alternatively, the series acoustic wave resonator R1 can be a first acoustic wave resonator of the switchable band pass filter 80 from a common node of a multiplexer for some other applications. In some instances, the switch 88 can select both series acoustic wave resonators R7A and R7B in a third state. In the switchable band pass filter 80, there is only a single switch loss.

FIG. 9 is a schematic diagram of a switchable band stop filter 24 according to an embodiment. The switchable band stop filter 24 has switchable series acoustic wave resonators R9A and R9B. In a band stop filter, series acoustic wave resonators typically impact a lower edge of a stop band. The switch 28 can select series acoustic wave resonator R9A in a first state and select series acoustic wave resonator R9B in a second state. This can adjust the lower edge of the stop band for the different states of the switchable band stop filter 24. In some instances, the switch 28 can select both series acoustic wave resonators R9A and R9B in a third state. In the switchable band stop filter 24, there is only a single switch loss.

FIG. 10 is a schematic diagram of a switchable band stop filter 100 according to another embodiment. The switchable band stop filter 100 has switchable shunt acoustic wave resonators R8A and R8B. In a band stop filter, shunt acoustic wave resonators typically impact an upper edge of a stop band. A switch 108 can select shunt acoustic wave resonator R8A in one state and select shunt acoustic wave resonator R8B in another state to adjust the upper edge of the stop band for different states of the switchable band stop filter 100. For example, the switchable band stop filter 100 can lower the upper band edge of a stop band for co-existence with another frequency band above the stop band. In some instances, the switch 108 can select both shunt acoustic wave resonators R8A and R8B in a third state. In the switchable band stop filter 100, there is only a single switch loss.

Although embodiments disclosed herein may relate to filters with a switch configured to selectively couple different acoustic wave resonators to a node of a filter, any suitable principles and advantages disclosed herein can implemented in applications with an acoustic wave resonator with fixed connection to a node of a filter and one or more other acoustic wave resonators that can be connected in parallel with the acoustic wave resonator by a switch as desired. For example, in some such applications, there can be one state where just a shunt acoustic wave resonator with the fixed connection is connected to a node and one or more other states with at least one other shunt acoustic wave resonator connected in parallel with the shunt acoustic wave resonator via a switch. As another example, in some applications, there can be one state where just a series acoustic wave resonator with the fixed connection is connected to a node and one or more other states with at least one other series acoustic wave resonator connected in parallel with the series acoustic wave resonator via a switch.

Figure 11:
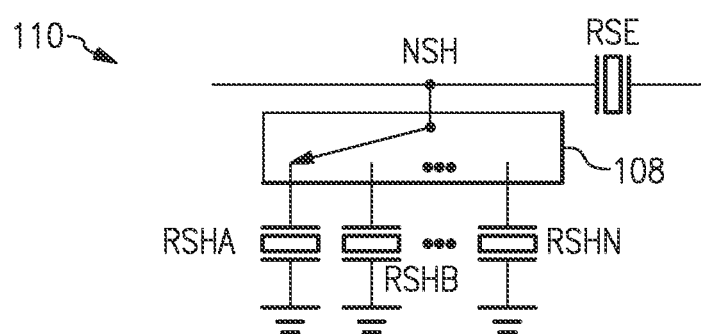
FIG. 11 is a schematic diagram illustrating a switch configured to selectively electrically connect shunt resonators to a node of an acoustic wave filter according to an embodiment.
Figure 12:
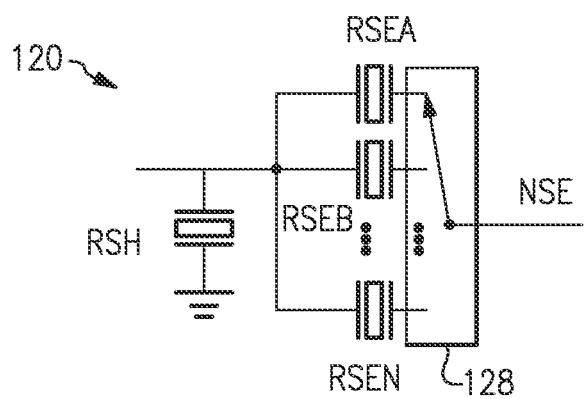
FIG. 12 is a schematic diagram illustrating a switch configured to selectively electrically connect series resonators to a node of an acoustic wave filter according to an embodiment.

Although embodiments disclosed herein may relate to filters with a switch configured to selectively couple two different acoustic wave resonators to a node of a filter, any suitable principles and advantages disclosed herein can be implemented with a switch configured to selectively couple three or more acoustic wave resonators to a node of a filter. FIGS. 11 and 12 illustrate examples of switches configured to selectively couple one or more of at least three switches to a node of a filter. Any suitable principles and advantages of these embodiments can be implemented together with each other and/or together with any suitable features of one or more other embodiments disclosed herein.

FIG. 11 is a schematic diagram illustrating a switch 118 configured to selectively electrically connect switchable shunt acoustic wave resonators RSHA, RSHB, RSHN to a node NSH of an acoustic wave filter stage 110 according to an embodiment. The switch 118 can select a different subset of the switchable acoustic wave resonators RSHA to RSHN to filter the radio frequency signal together with at least the series acoustic wave resonator RSE in a first state than in a second state. Selecting the different subsets of switchable acoustic wave resonators RSHA to RSHN can move a band edge of a filter that includes the filter stage 110 in the frequency domain. The switch 118 can electrically connect a single one of the shunt acoustic wave resonators RSHA, RSHB, RSHN to the node NSH at a time. The switch 118 can alternatively or additionally electrically connect two or more of the shunt acoustic wave resonators RSHA, RSHB, RSHN to the node NSH at a time. The illustrated filter stage 110 also includes series acoustic wave resonator RSE. The filter stage 110 can be included in a filter with one or more other acoustic wave resonator filter stages. Alternatively or additionally, the filter stage 110 can be included in filter with an inductor-capacitor circuit.

FIG. 12 is a schematic diagram illustrating a switch 128 configured to selectively electrically connect switchable series acoustic wave resonators RSEA, RSEB, RSEN to a node NSE of an acoustic wave filter stage 120 according to an embodiment. The switch 128 can select a different subset of the switchable acoustic wave resonators RSEA to RSEN to filter the radio frequency signal together with at least the shunt acoustic wave resonator RSH in a first state than in a second state. Selecting the different subsets of switchable acoustic wave resonators RSEA to RSEN can move a band edge of a filter that includes the filter stage 120 in the frequency domain. The switch 128 can electrically connect a single one of the series acoustic wave resonators RSEA, RSEB, RSEN to the node NSE at a time. The switch 128 can alternatively or additionally electrically connect two or more of the series acoustic wave resonators RSEA, RSEB, RSEN to the node NSE at a time. The illustrated filter stage 120 also includes shunt acoustic wave resonator RSH. The filter stage 120 can be included in a filter with one or more other acoustic wave resonator filter stages. Alternatively or additionally, the filter stage 120 can be included in filter with an inductor-capacitor circuit.

As discussed above, any suitable principles and advantages disclosed herein can be implemented in any suitable multiplexers. Any subset of filters of such multiplexers or all filters of such multiplexers can be switchable. Embodiments of triplexers with one or more switchable acoustic wave filters will be discussed with reference to FIGS. 13 to 22. In these embodiments, bandwidth of a switchable acoustic wave filter can be adjusted by a switch selectively coupling one or more acoustic wave resonators to a node of the filter. Any suitable combination of features of these triplexers can be implemented together with each other and/or any other suitable combination of features disclosed herein.

Figure 13:
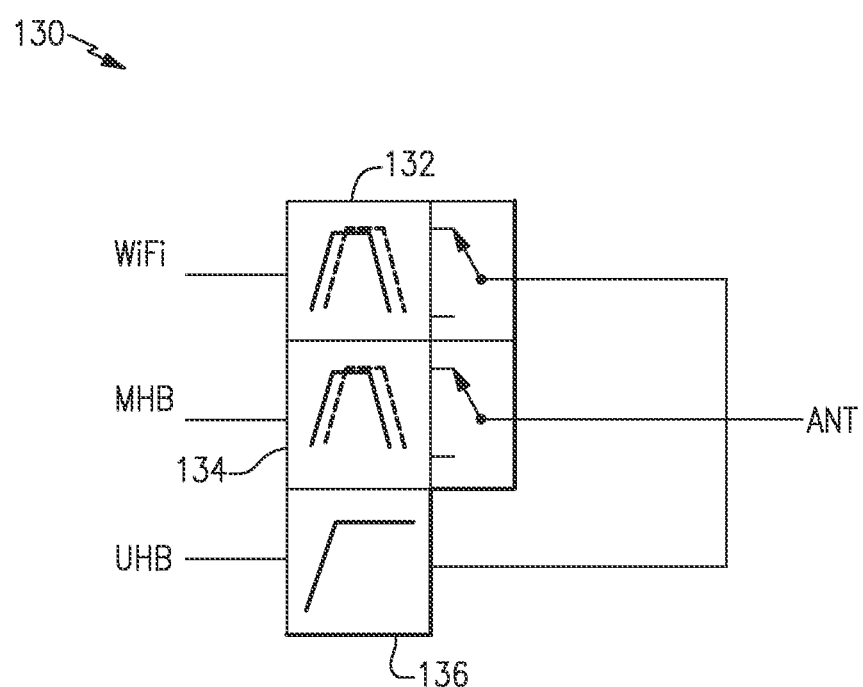
FIG. 13 is a schematic block diagram of a multiplexer according to an embodiment.

FIG. 13 is a schematic block diagram of a multiplexer 130 according to an embodiment. The multiplexer 130 is a triplexer. As illustrated, the multiplexer 130 includes a first switchable acoustic wave filter 132, a second switchable acoustic wave filter 134, and third filter 136. The illustrated filters 132, 134, and 136 are coupled to each other at an antenna node ANT. The multiplexer 130 can be an antenna-plexer.

The first switchable acoustic wave filter 132 can be a band pass filter. The first switchable acoustic wave filter 132 can be a band pass filter configured to pass 2.4 GHz Wi-Fi signals. The bandwidth of the first switchable acoustic wave filter 132 can be adjusted in accordance with any suitable principles and advantages disclosed herein. The first switchable acoustic wave filter 132 is shown in block form and the illustrated symbol represents that the first switchable acoustic wave filter 132 can change bandwidth in different states. The same output node of the first switchable acoustic wave filter 132 can be coupled to the antenna node ANT in the different states.

The second switchable acoustic wave filter 134 can be a MHB filter. The second switchable acoustic wave filter 134 can include a notch in its pass band for a frequency band corresponding to the first switchable acoustic wave filter 132. For example, the second switchable acoustic wave filter 134 can have aa notch for a 2.4 GHz Wi-Fi band. The notch bandwidth of the second switchable acoustic wave filter 134 can be adjusted in accordance with any suitable principles and advantages disclosed herein. The second switchable acoustic wave filter 134 is shown in block form and the illustrated symbol represents that the second switchable acoustic wave filter 134 can change notch bandwidth in different states. The same output node of the second switchable acoustic wave filter 134 can be coupled to the antenna node ANT in the different states.

The third filter 136 can be a high pass filter. The third filter 136 can be an ultra high band (UHB) filter. The third filter can be an inductor-capacitor filter that includes inductors and capacitors, or inductors and capacitors plus one or more acoustic wave resonators.

Examples of the multiplexer 130 are discussed with reference to FIGS. 14A-16, 19, and 20. Examples of a similar multiplexer with one switchable acoustic wave filter are discussed with reference to FIGS. 17 and 18. Any suitable combination of features of the embodiments of FIGS. 13 to 20 can be implemented together with each other.

Figure 14A:
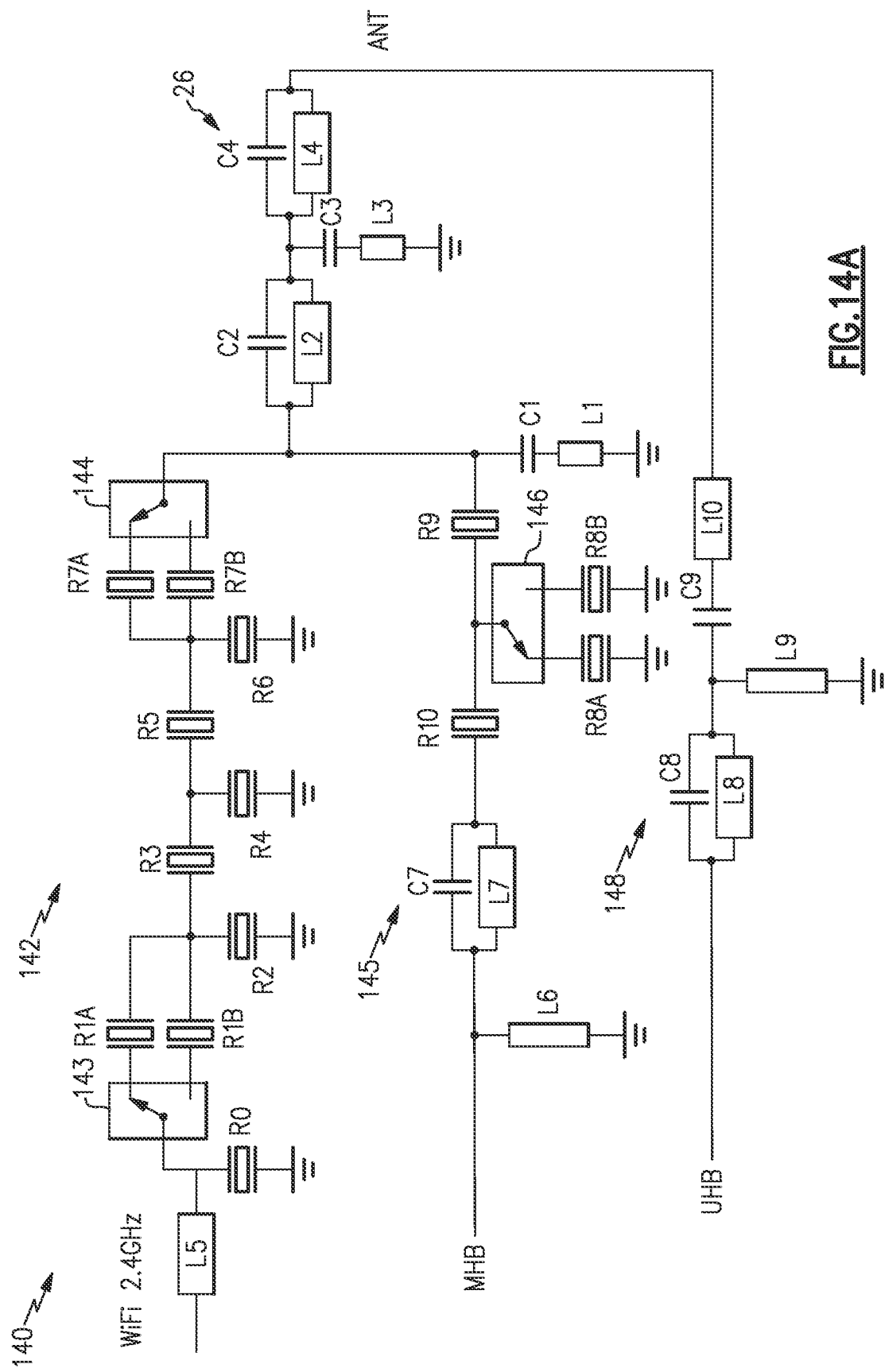
FIG. 14A is a schematic diagram of a multiplexer with switchable filters according to an embodiment.

FIG. 14A is a schematic diagram of a multiplexer 140 with switchable filters according to an embodiment. The multiplexer 140 is an example of the multiplexer 130 of FIG. 13. As illustrated, the multiplexer 140 includes a first switchable acoustic wave filter 142, a second switchable acoustic wave filter 145, a third filter 148, and a passive impedance network 26.

The first switchable acoustic wave filter 142 includes switches 143 and 144 each configured to selectively electrically connect acoustic wave resonators to respective nodes of the first switchable acoustic wave filter 142. The first switchable acoustic wave filter 142 also includes acoustic wave resonators R0, R1A, R1B, R2, R3, R4, R5, R6, R7A, and R7B and series inductor L5. The acoustic wave resonators R1A, R1B, R7A, and R7B are switchable acoustic wave resonators.

The switches 143 and 144 can connect different acoustic wave resonators to nodes of the filter to adjust bandwidth of the first switchable filters for different states. For example, in a first state, the switch 143 can connect acoustic wave resonator R1A to the acoustic wave resonator R0 and electrically isolate acoustic wave resonator R1B from the acoustic wave resonator R0. The switch 144 can connect acoustic wave resonator R7A to the passive impedance network 26 and electrically isolate acoustic wave resonator R7B from the passive impedance network 26 in the first state. In this example, the switch 143 can connect acoustic wave resonator R1B to the acoustic wave resonator R0 and electrically isolate acoustic wave resonator R1A from the acoustic wave resonator R0 in the second state. The switch 144 can connect acoustic wave resonator R7B to the passive impedance network 26 and electrically isolate acoustic wave resonator R7A from the passive impedance network 26 in the second state.

In the multiplexer 140, the first switchable acoustic wave filter 142 and the second switchable acoustic wave filter 145 are coupled to the antenna node ANT by way of the passive impedance network 26. The passive impedance network can implement an LC filter. The LC filter can attenuate one or more harmonics generated by one or more switches (e.g., the switches 144 and/or 146) of the switchable acoustic wave filters 142 and/or 145. This can suppress the one or more harmonics at the antenna node ANT. The LC filter can suppress intermodulation distortion and/or spurious responses. The LC filter can provide low pass filtering to protect one or more switches and/or acoustic wave resonators of the multiplexer 140 from one or more relatively high power blocker signals.

In certain applications, the first switchable acoustic wave filter 142 can be a band pass filter for a 2.4 GHz Wi-Fi band. As an example, the switches 143 and 144 can adjust a pass band of the first switchable acoustic wave filter 142 from 2.40 GHz to 2.48 GHz in a first state to 2.40 GHz to 2.46 GHz in a second state. The first state can correspond to passing the full 2.4 GHz Wi-Fi band in this example. In the second state, high isolation can be provided for Band 53 (2.4835 GHz to 2.495 GHz) while performance at an upper end of the 2.4 GHz Wi-Fi band can be sacrificed in this example.

The second switchable acoustic wave filter 145 includes a switch 146 configured to selectively electrically connect different acoustic wave resonators to a node of the second switchable acoustic wave filter 145. The switchable acoustic wave filter 145 includes capacitors C1 and C7, inductors L1, L6, and L7, and acoustic wave resonators R8A, R8B, R9, and R10. The acoustic wave resonators R8A and R8B are switchable acoustic wave resonators. The switch 146 can connect different acoustic wave resonators to the node, and adjust stop band bandwidth of the second switchable filter 145 for different states. In certain applications, the switchable acoustic wave filter 145 can be a band stop pass filter configured to provide a stop band corresponding to a 2.4 GHz Wi-Fi band for a MHB filter. As an example, the switch 146 can adjust the stop band of second first switchable acoustic wave filter 145 from 2.40 GHz to 2.48 GHz in a first state to 2.40 GHz to 2.46 GHz in a second state. The switch 146 can electrically connect acoustic wave resonator R8A to a node between acoustic wave resonators R9 and R10 in the first state and electrically isolate acoustic wave resonator R8B from the node between acoustic wave resonators R9 and R10 in the first state. The switch 146 can electrically connect acoustic wave resonator R8B to the node between acoustic wave resonators R9 and R10 in the second state and electrically isolate acoustic wave resonator R8A from the node between acoustic wave resonators R9 and R10 in the second state. The first state can correspond to passing the full 2.4 GHz Wi-Fi band in this example. In the second state, high isolation can be provided for Band 53 while stop band performance at an upper end of the 2.4 GHz Wi-Fi band can be sacrificed in this example.

The third filter 148 can be a high pass filter. The third filter can pass an UHB signal. As illustrated, the third filter 148 is an inductor-capacitor filter. The illustrated third filter 148 includes capacitors C8 and C9 and inductors L8, L9, and L10. The third filter 148 can include any suitable type of inductors and any suitable type of capacitor. The third filter 148 can be implemented with any suitable inductor-capacitor filter topology, any suitable acoustic wave resonator filter topology, or any suitable filter topology that includes an inductor-capacitor circuit and one or more acoustic wave resonators. The third filter 148 is connected to the first switchable acoustic wave filter 142 and the second switchable acoustic wave filter 145 at a common node of the multiplexer 140. The common node can be an antenna node ANT as illustrated.

Figure 14B:
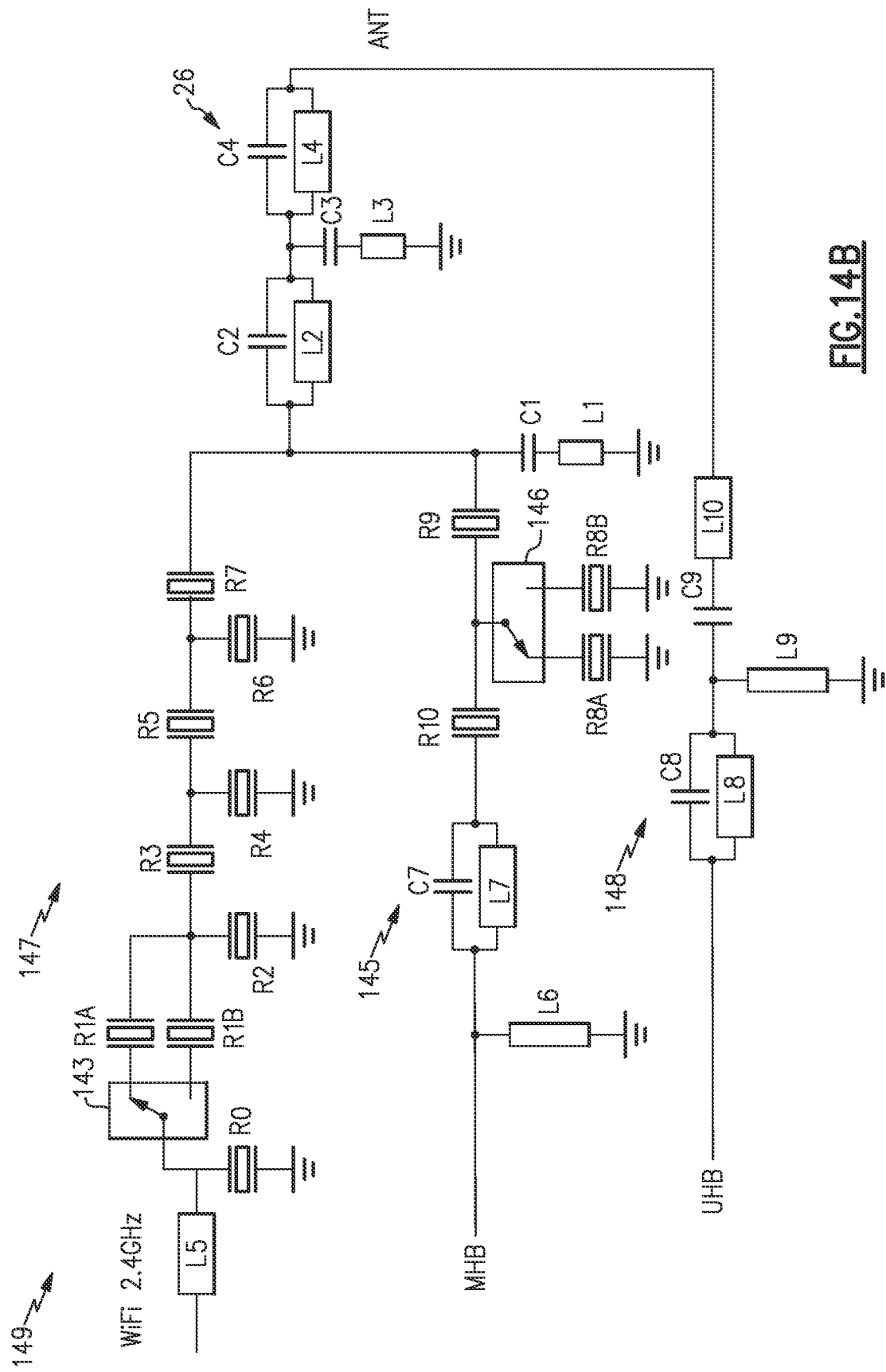
FIG. 14B is a schematic diagram of a multiplexer with switchable filters according to an embodiment.

FIG. 14B is a schematic diagram of a multiplexer 149 with switchable filters according to another embodiment. The multiplexer 149 is like the multiplexer 140 of FIG. 14A, except that acoustic wave resonator R7 is implemented in place of the switch 144 and corresponding switchable acoustic wave resonators R7A and R7B in a switchable acoustic wave filter 147 of FIG. 14B. In the switchable acoustic wave filter 147, the switch 143 is located away from the antenna node ANT. Accordingly, intermodulation distortion and/or harmonic distortion associated with the switch 143 are introduced away from the antenna node ANT. Such intermodulation distortion and/or harmonic distortion can be attenuated at the antenna node ANT.

Figure 15:
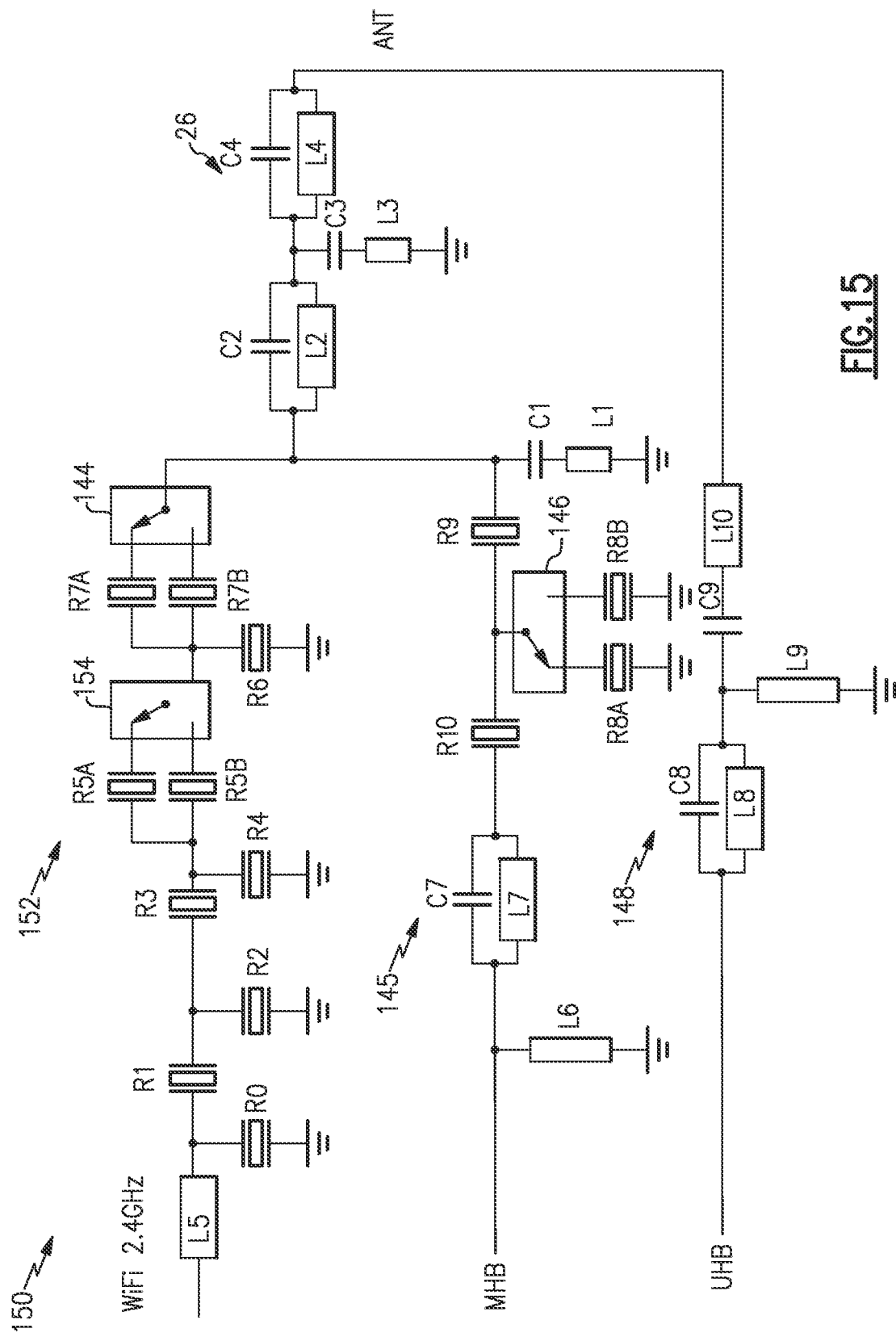
FIG. 15 is a schematic diagram of a multiplexer with switchable filters according to another embodiment.

FIG. 15 is a schematic diagram of a multiplexer 150 with switchable filters according to another embodiment. The multiplexer 150 is like the multiplexer 140 of FIG. 14A, except that a switch 154 and corresponding switchable acoustic wave resonators R5A and R5B are located in a different location in the filter topology of a first switchable filter 152 compared to the switch 143 and corresponding switchable acoustic wave resonators R1A and R1B of the first switchable filter 142 of FIG. 14A. A switch configured to selectively electrically connect acoustic wave resonators to a node of a filter can be located at any suitable location in a filter topology for a particular application. Two or more switches configured to selectively electrically connect acoustic wave resonators to a respective node of a filter can be located at any suitable locations in a filter topology for a particular application.

Figure 16:
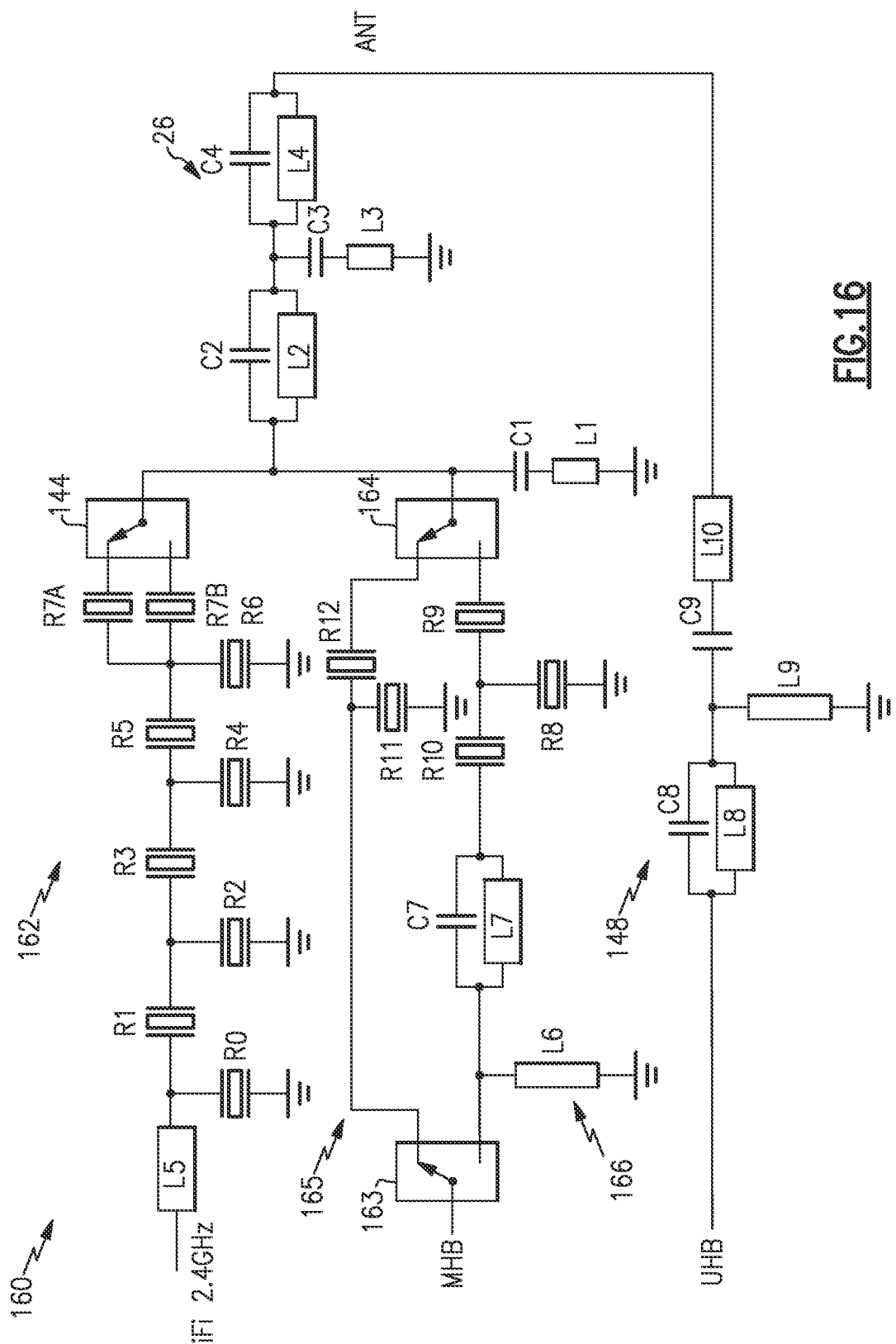
FIG. 16 is a schematic diagram of a multiplexer with switchable filters according to another embodiment.

FIG. 16 is a schematic diagram of a multiplexer 160 with switchable filters according to another embodiment. In the multiplexer 160, a first switchable filter 162 includes one switch 144 to selectively electrically connect switchable acoustic wave resonators R7A and R7B to a node of the first switchable filter 162. The switch 144 can adjust bandwidth of the first switchable filter 162. The multiplexer 160 also includes a second switchable filter. The second switchable filter includes switches 163 and 164 that together select a first sub filter 165 or a second sub filter 166. Each of the sub filters 165 and 166 include at least one filter stage and a plurality of acoustic wave resonators. As illustrated, the first sub filter 165 includes acoustic wave resonators R11 and R12. The illustrated second sub filter 166 includes acoustic wave resonators R8, R9, and R10 and an inductor-capacitor circuit. The inductor-capacitor circuit of the second sub filter can include inductors L6 and L7 and capacitor C7.

Figure 17:
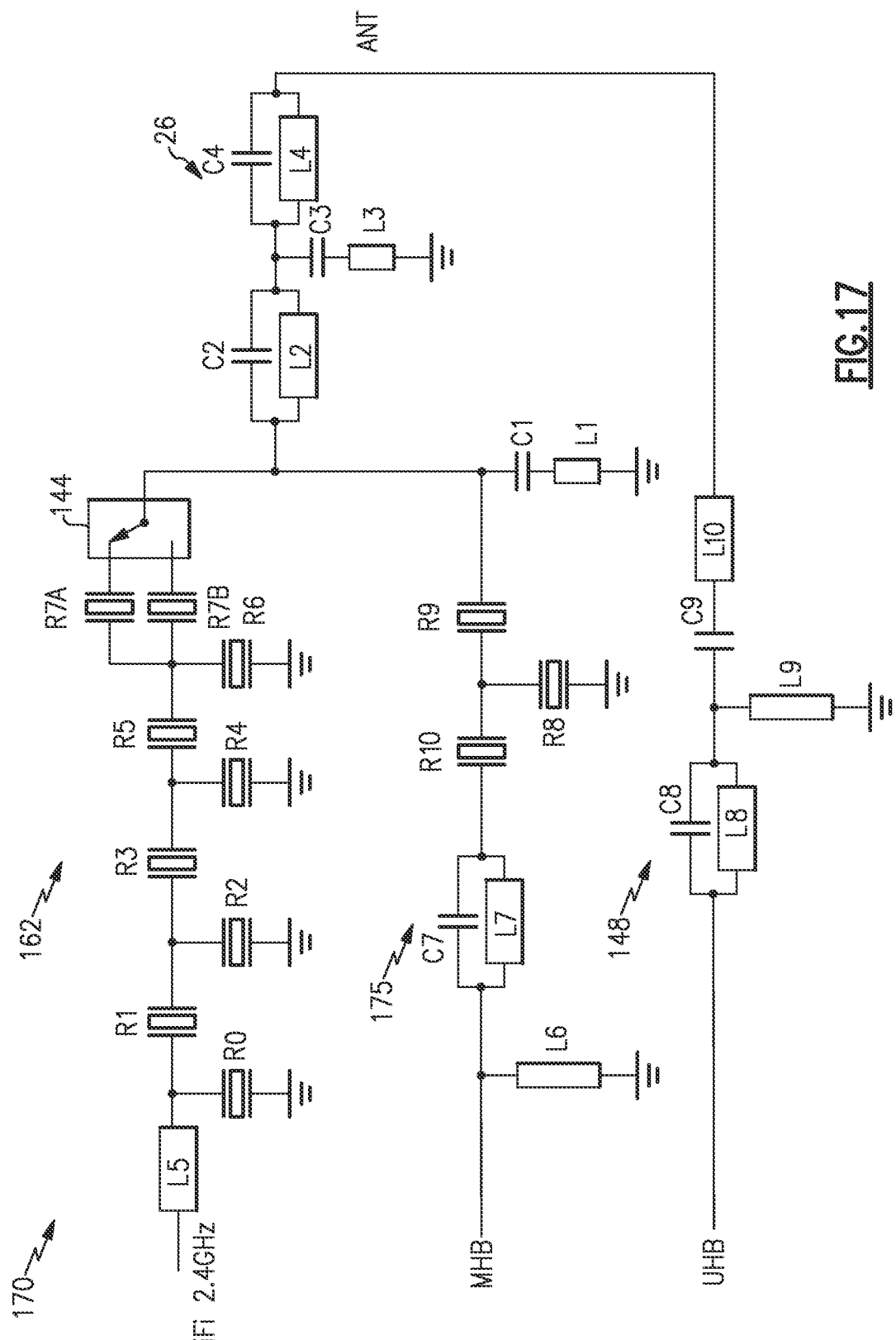
FIG. 17 is a schematic diagram of a multiplexer with a switchable filter according to an embodiment.

FIG. 17 is a schematic diagram of a multiplexer 170 with a switchable filter according to an embodiment. The multiplexer 170 includes a single switchable filter. In the multiplexer 170, the first switchable filter 162 is a switchable band pass filter. In the multiplexer 170, the second filter 175 is fixed rather than switchable. The second filter 175 can be the same or similar to the second sub filter 166 of FIG. 16. Switching the first switchable filter 162 to adjust bandwidth of the first switchable filter 162 together with the stop band of produced by the second filter 175 can be sufficient to meet performance specifications in certain applications.

Figure 18:
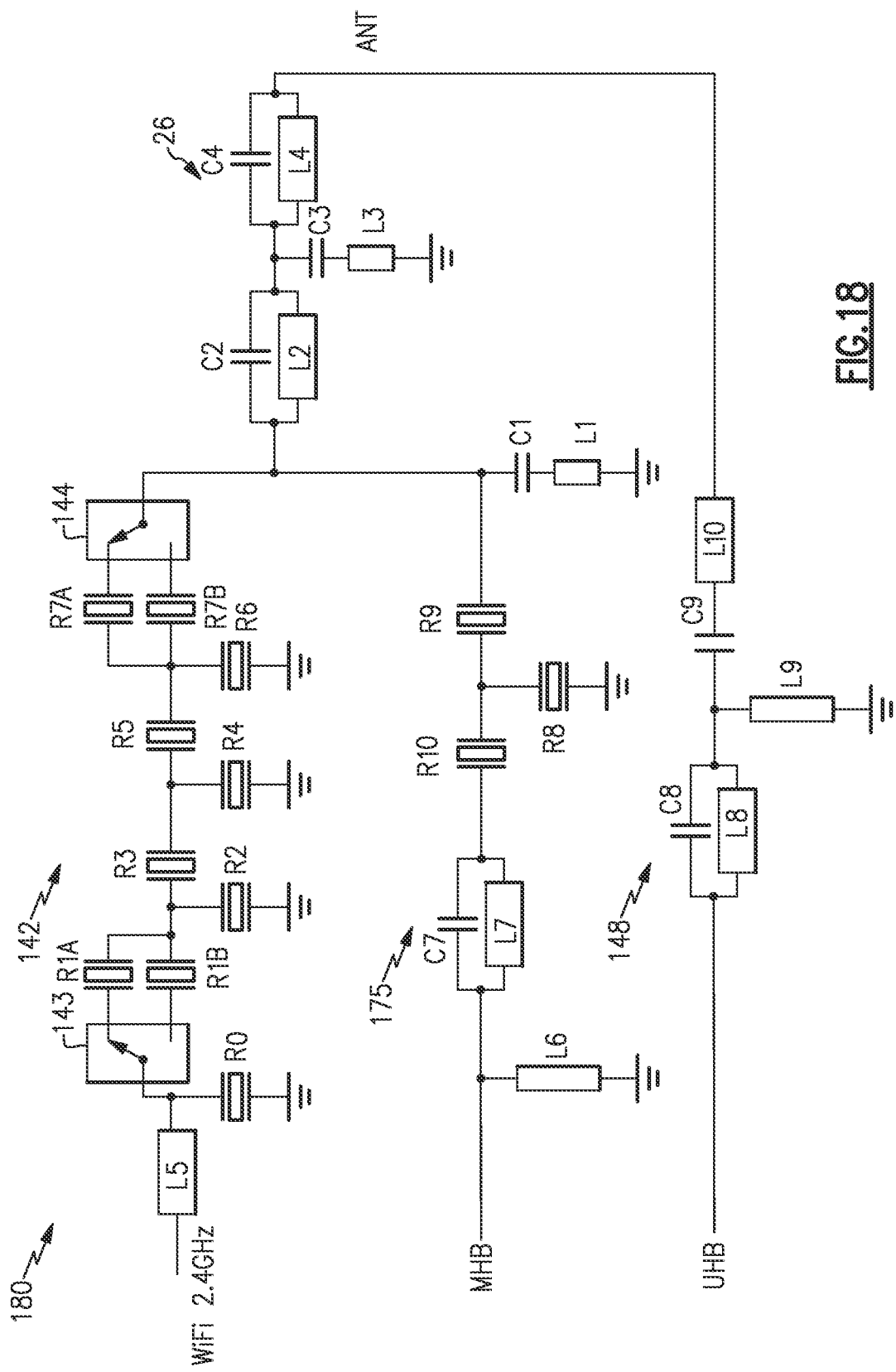
FIG. 18 is a schematic diagram of a multiplexer with a switchable filter according to another embodiment.

FIG. 18 is a schematic diagram of a multiplexer 180 with a switchable filter according to another embodiment. The multiplexer 180 is like the multiplexer 170 of FIG. 17, except that the first switchable acoustic wave filter 142 of the multiplexer 180 includes two switches and corresponding switchable acoustic wave resonators. The multiplexer 180 is like the multiplexer 140 of FIG. 14A, except that the second filter 175 of the multiplexer 180 is fixed rather than switchable.

Figure 19:
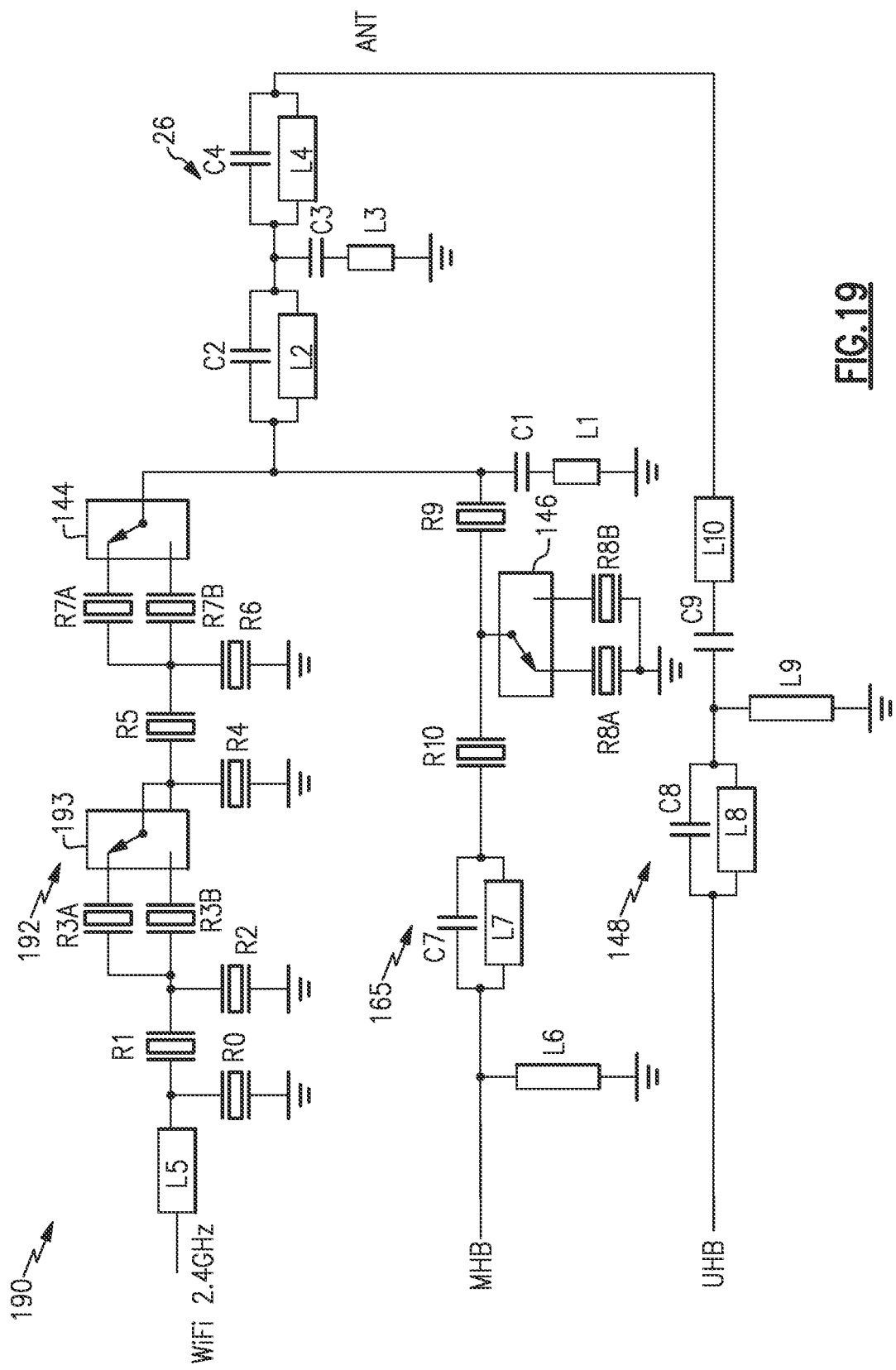
FIG. 19 is a schematic diagram of a multiplexer with switchable filters according to another embodiment.

FIG. 19 is a schematic diagram of a multiplexer 190 with switchable filters according to another embodiment. The multiplexer includes a first switchable filter 192 with switches 193 and 144 and switchable acoustic wave resonators R3A, R3B, R7A, and R7B. The multiplexer 190 is like the multiplexers 140 and 150 of FIGS. 14A and 15, respectively, except that the first switchable acoustic wave filter 192 of the multiplexer 190 includes a switch 193 and corresponding switchable acoustic wave resonators R3A and R3B at different locations in the filter topology. The multiplexer 190 is like the multiplexer 140 of FIG. 14A, except that the switch 193 and corresponding switchable acoustic wave resonators R3A and R3B are in a different location in the filter topology than the switch 143 and corresponding switchable acoustic wave resonators R1A and R1B of the multiplexer 140. The multiplexer 190 is like the multiplexer 150 of FIG. 15, except that the switch 193 and corresponding switchable acoustic wave resonators R3A and R3B are in a different location in the filter topology than the switch 154 and corresponding switchable acoustic wave resonators R5A and R5B of the multiplexer 150.

Figure 20:
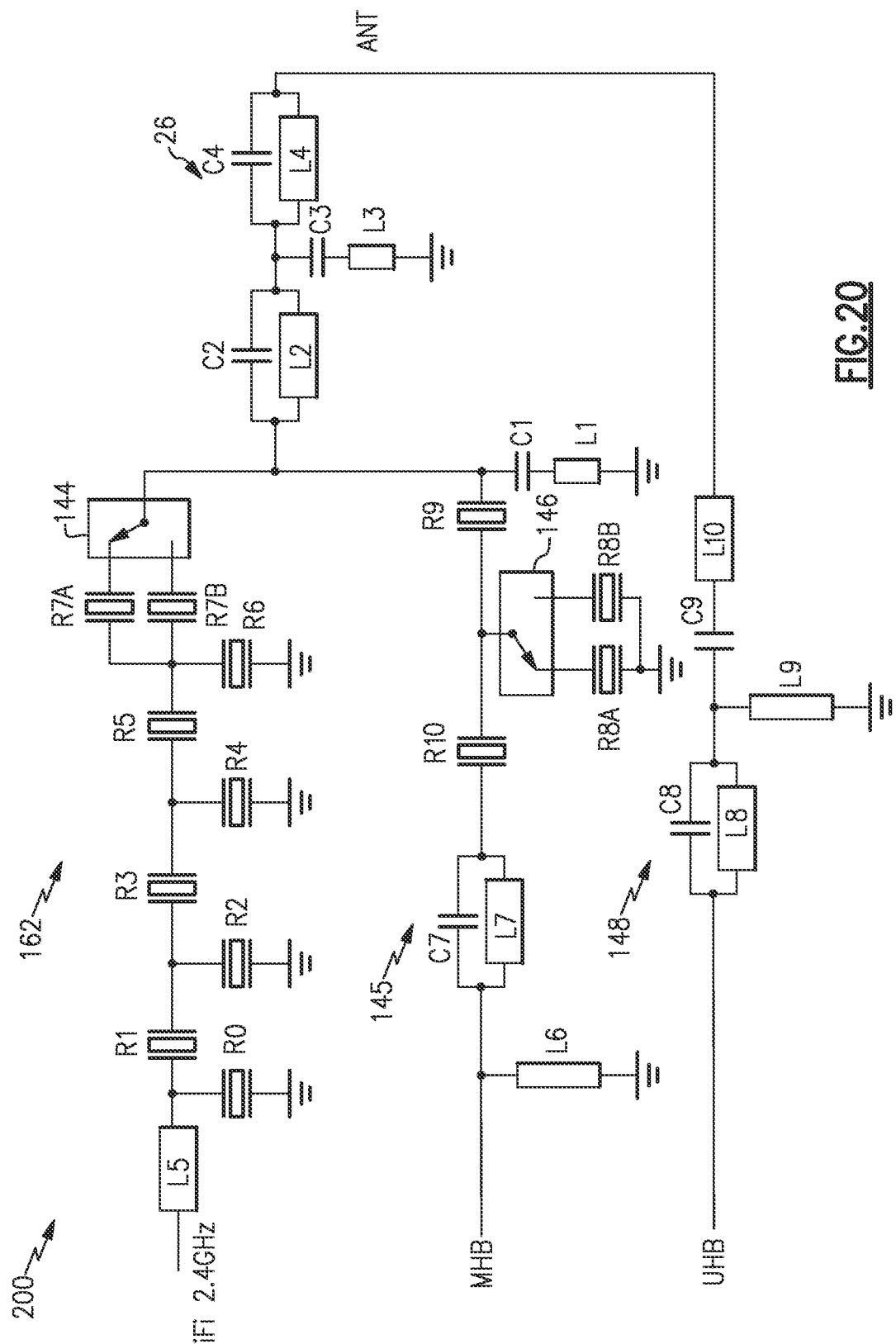
FIG. 20 is a schematic diagram of a multiplexer with switchable filters according to an embodiment.

FIG. 20 is a schematic diagram of a multiplexer 200 with switchable filters according to an embodiment. The multiplexer 200 is like the multiplexers 140, 150, and 190, except the multiplexer 200 includes a first switchable acoustic wave filter 162 with a single switch 144.

In switchable filters disclosed herein, switchable acoustic wave resonators can have one end electrically connected to a filter and another end electrically isolated from the filter in certain states. A termination impedance can be electrically connected in parallel with one or more switchable acoustic wave resonators via a switch when the one or more acoustic wave resonators are not selected. Such a termination impedance can improve spurious performance. Example termination impedances and related switches are discussed with reference to FIGS. 21 and 22. Any suitable principles and advantages discussed with reference to FIGS. 21 and/or 22 can be implemented in accordance with any suitable principles and advantages of any of the embodiments discussed above.

Figure 21:
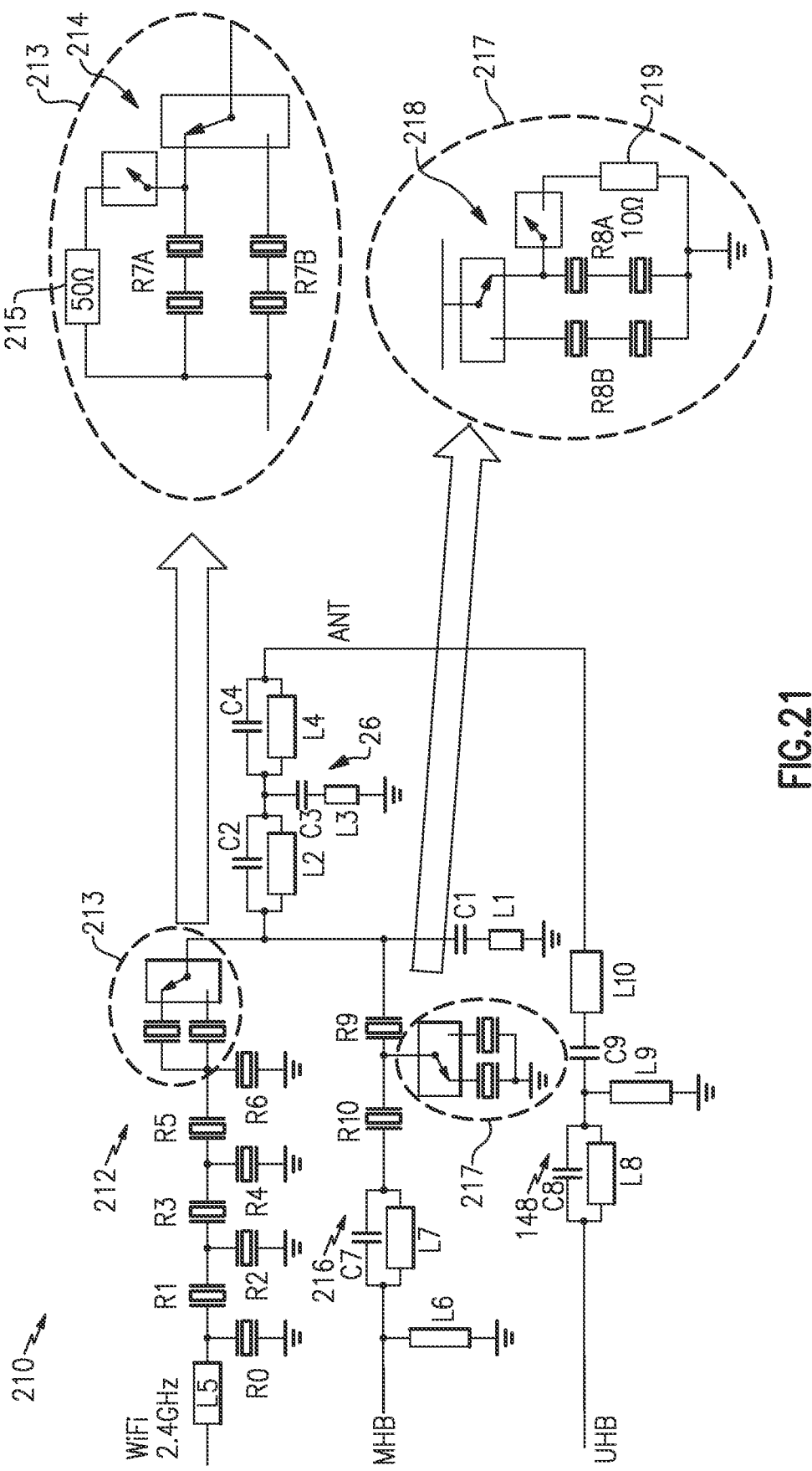
FIG. 21 is a schematic diagram of a multiplexer with switchable filters with termination impedances according to an embodiment.

FIG. 21 is a schematic diagram of a multiplexer 210 with switchable filters with termination impedances according to an embodiment. In the multiplexer 210, a first switchable filter 212 includes a switchable circuit 213. A switch 214 of the switchable circuit 213 can selectively connect switchable acoustic wave resonators R7A, R7B to a node of the first switchable filter 212. The switch 214 can also electrically connect an unselected switchable acoustic wave resonator to a termination impedance 215. The termination impedance 215 can be any suitable termination impedance, such as one or more resistors, one or more capacitors, one or more inductors, one or more resistors connected to one or more inductors, the like, or any suitable combination thereof. The termination impedance 215 can include any suitable passive impedance element(s) to provide desirable performance of spurs in a pass band and/or a rejection band. The termination impedance 215 can be 50 Ohms, for example. The switch 214 can connect the termination impedance 215 in parallel with an unselected switchable series acoustic wave resonator.

In the switchable circuit 213, the termination impedance 215 is connectable in parallel with a single switchable acoustic wave resonator R7A. The switch 214 can selectively electrically connect an electrode of the switchable acoustic wave resonator R7A to the termination impedance 215. The switch 214 can connect the termination impedance 215 in parallel with the switchable acoustic wave resonator R7A when unselected and electrically isolate an end of the termination impedance 215 from the switchable acoustic wave resonator R7A when selected. As illustrated, in FIG. 20, the switchable acoustic wave resonator R7A is selected and an end of the termination impedance 215 is electrically isolated from the switchable acoustic wave resonator R7A. The termination impedance 215 can be connectable in parallel with a switchable acoustic wave resonator R7A that is selected for a mode where the pass band of the filter 212 is reduced. The termination impedance 215 can be connectable in parallel with a switchable acoustic wave resonator R7A that is selected for a co-existence mode. The termination impedance 215 can be connectable in parallel with a switchable acoustic wave resonator R7A selectively.

The multiplexer 210 also includes a second switchable filter 216 with a switchable circuit 217. A switch 218 of the switchable circuit 217 can selectively connect switchable acoustic wave resonators R8A, R8B to a node of the second switchable filter 216. The switch 218 can also electrically connect an unselected acoustic wave resonator to a termination impedance 219. The termination impedance 219 can be any suitable termination impedance, such as one or more resistors, one or more capacitors, one or more inductors, one or more resistors connected to one or more inductors, the like, or any suitable combination thereof. The termination impedance 219 can include any suitable passive impedance element(s) to provide desirable performance of spurs in a pass band and/or a rejection band. The termination impedance 219 can be 10 Ohms, for example. The switch 218 can connect the termination impedance 219 in parallel with an unselected shunt acoustic wave resonator.

In the switchable circuit 217, the termination impedance 219 is connectable in parallel with a single switchable acoustic wave resonator R8A. The switch 218 can selectively electrically connect an electrode of the switchable acoustic wave resonator R8A to the termination impedance 219. The switch 218 can connect the termination impedance 219 in parallel with the switchable acoustic wave resonator R8A when the switchable acoustic wave resonator R8A is unselected and electrically isolate an end of the termination impedance 219 from the switchable acoustic wave resonator R8A when the switchable acoustic wave resonator R8A is selected. As illustrated, in FIG. 20, the switchable acoustic wave resonator R8A is selected and an end of the termination impedance 219 is electrically isolated from the switchable acoustic wave resonator R8A. The termination impedance 219 can be connectable in parallel with a switchable acoustic wave resonator R8A that is selected for a mode where a stop band is reduced, for a co-existence mode, for a relatively small percentage of the time, the like, or any suitable combination thereof.

In the switchable circuits 213 and 217, acoustic wave resonators R7A, R7B, R8A, and R8A are illustrated as two acoustic wave resonators in series with each other. An individual acoustic wave resonator can be split into series resonators or parallel resonators. Any of the acoustic wave resonators shown in the drawings can be implemented by acoustic wave resonators in series with each other. Any of the acoustic wave resonators shown in the drawings can be implemented by acoustic wave resonators in parallel with each other.

Figure 22:
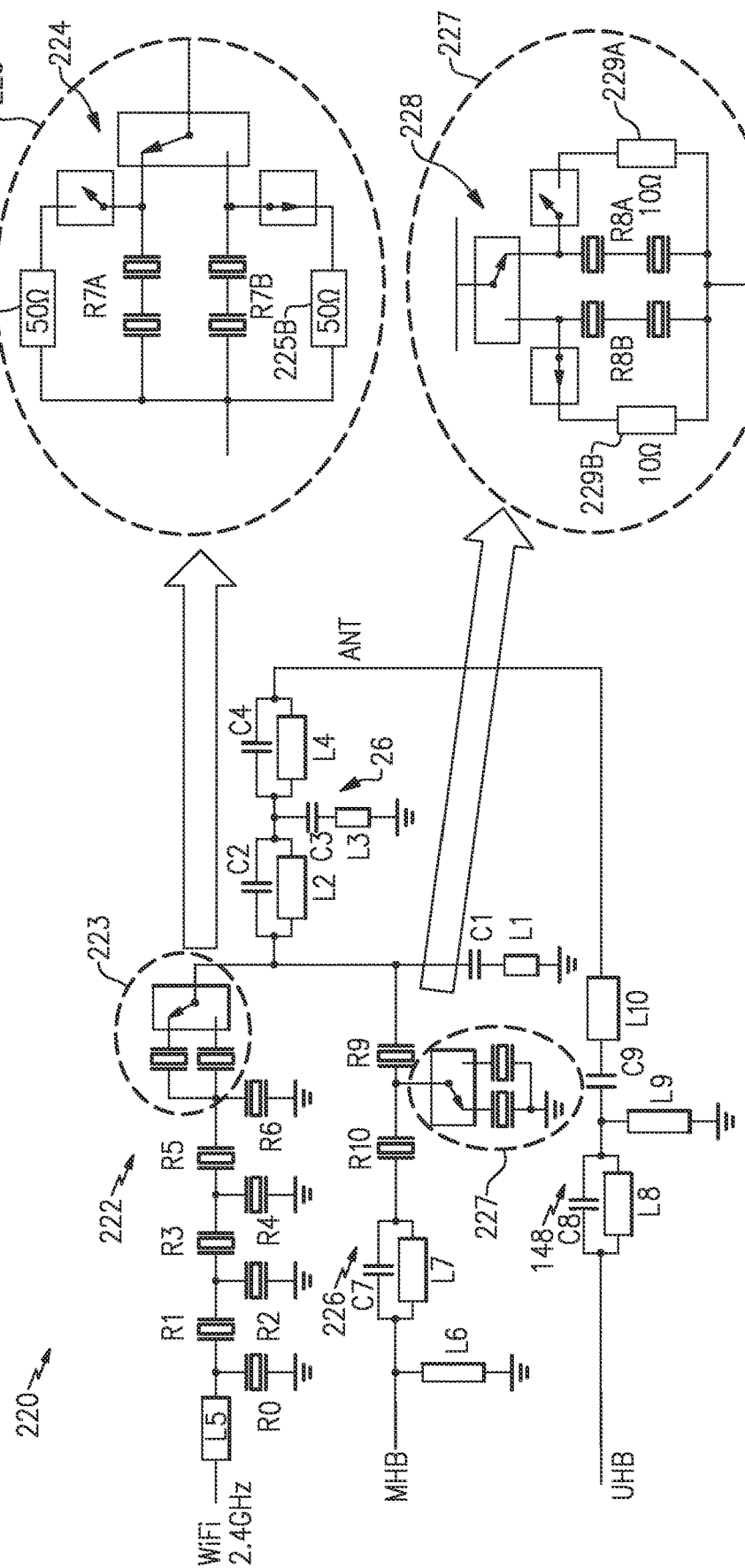
FIG. 22 is a schematic diagram of a multiplexer with switchable filters with termination impedances according to another embodiment.

FIG. 22 is a schematic diagram of a multiplexer 220 with switchable filters with termination impedances according to another embodiment. The multiplexer 220 is like the multiplexer 210 of FIG. 21, except that a termination impedance is connectable in parallel with each switchable acoustic wave resonator. The termination impedances of the multiplexer 220 can include any suitable combination of features of the multiplexer 210.

In the multiplexer 220, each unselected switchable acoustic wave resonator can be connected in parallel with a termination impedance. The multiplexer 220 includes a first switchable filter 222 with a switchable circuit 223. A switch 224 of the switchable circuit 223 can connect a termination impedance 225A or 225B in parallel with an unselected series acoustic wave resonator R7A or R7B, respectively. The multiplexer 220 also includes a second switchable filter 226 with a switchable circuit 227. A switch 228 of the switchable circuit 227 can connect a termination impedance 229A or 229B in parallel with an unselected shunt acoustic wave resonator R8A or R8B, respectively.

Figure 23:
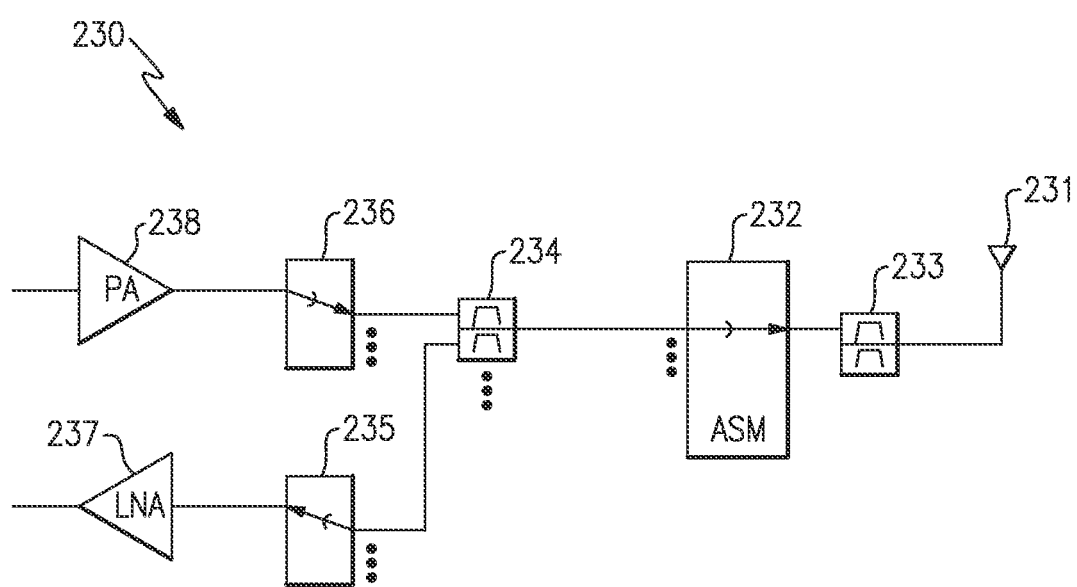
FIG. 23 is a schematic diagram of a radio frequency system with a multiplexer according to an embodiment.

Switchable acoustic wave filters disclosed herein can be implemented in radio frequency systems. FIG. 23 is a schematic diagram of an example radio frequency system 230 with a multiplexer according to an embodiment. As illustrated, the radio frequency system includes an antenna 231, an antenna switch 232, an antenna-plexer 233 connected between the antenna 231 and the antenna switch 232, at least one duplexer 234, a receive switch 235, a transmit switch 236, a low noise amplifier 237, and a power amplifier 238. The antenna-plexer 233 can include one or more switchable acoustic wave filters in accordance with any suitable principles and advantages disclosed herein. The antenna-plexer 231 can be electrically connected to the antenna 231 at an antenna port. The duplexer 234 can include one or more switchable acoustic wave filters in accordance with any suitable principles and advantages disclosed herein.

In the radio frequency system 230, the antenna 231 can transmit and receive RF signals. The antenna-plexer 233 can provide frequency domain multiplexing for signals propagating between the antenna 231 and radio frequency signal paths. One such radio frequency signal path includes the antenna switch 232. The antenna switch 232 can selective electrically connect a multiplexer or a standalone filter to the antenna-plexer 233. As illustrated, the antenna switch 232 can selective electrically connect the duplexer 234 to the antenna-plexer 233. The duplexer 234 includes a receive filter configured to filter a radio frequency signal received by the antenna 231 and to provide a filtered radio frequency signal to the low noise amplifier 237 via a receive switch 236. The low noise amplifier 237 can amplify the filtered radio frequency signal. The duplexer 234 also includes a transmit filter configured to filter a radio frequency signal generated by the power amplifier 238 for transmission by the antenna 231. The power amplifier 238 can amplify a radio frequency signal. The transmit switch 236 can connect the power amplifier 238 to the transmit filter of the duplexer 234.

Figure 24:
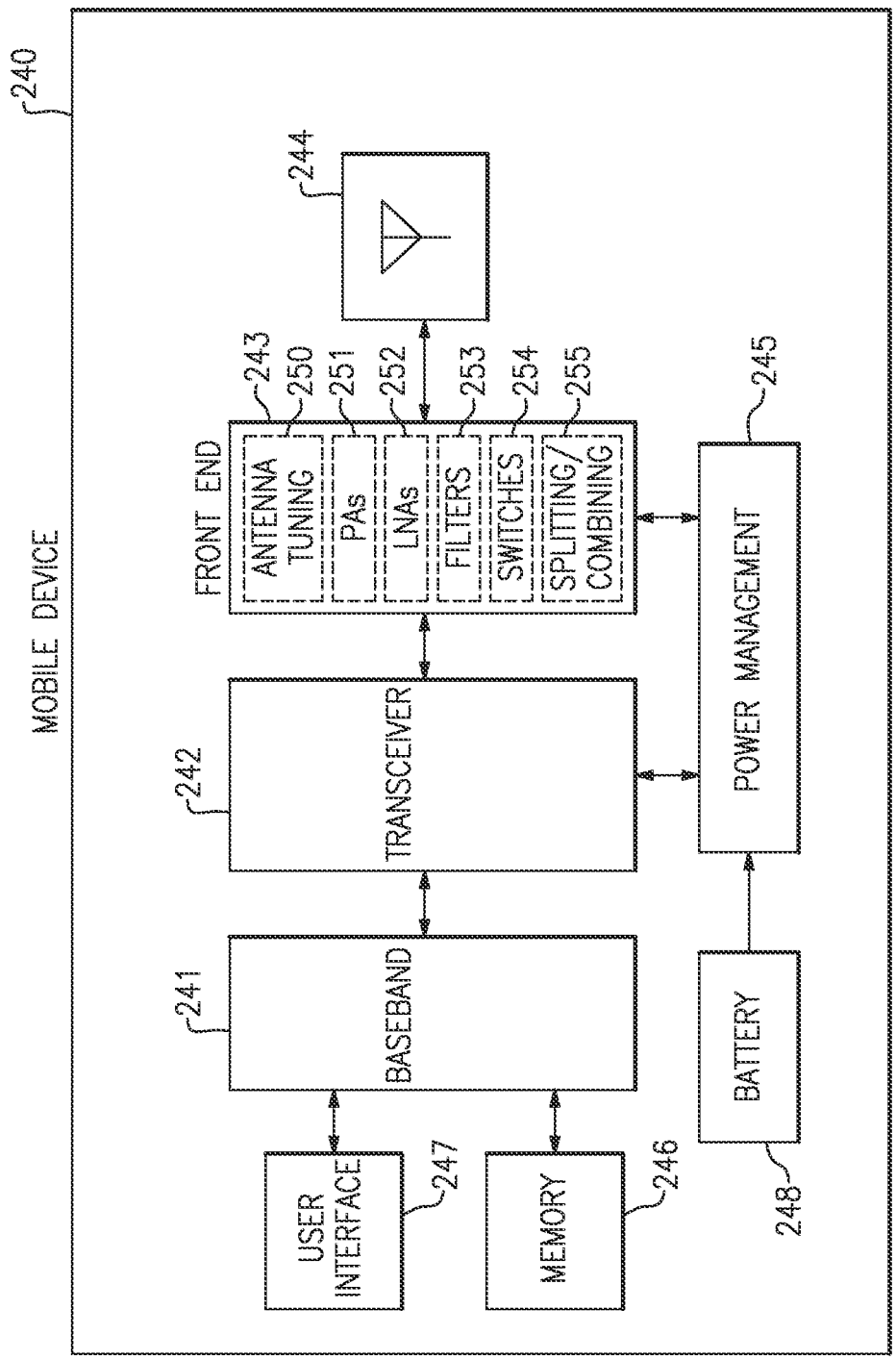
FIG. 24 is a schematic block diagram of a wireless communication device that includes a filter according to an embodiment.

The switchable acoustic wave filters disclosed herein can be implemented in wireless communication devices. FIG. 24 is a schematic block diagram of a wireless communication device 240 that includes a switchable acoustic wave filter according to an embodiment. The wireless communication device 240 can be a mobile device. The wireless communication device 240 can be any suitable wireless communication device. For instance, a wireless communication device 240 can be a mobile phone, such as a smart phone. As illustrated, the wireless communication device 240 includes a baseband system 241, a transceiver 242, a front end system 243, one or more antennas 244, a power management system 245, a memory 246, a user interface 247, and a battery 248.

The wireless communication device 240 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 242 generates RF signals for transmission and processes incoming RF signals received from the antennas 244. Various functionalities associated with the transmission and receiving of RF signals can be achieved by one or more components that are collectively represented in FIG. 24 as the transceiver 242. In one example, separate components (for instance, separate circuits or dies) can be provided for handling certain types of RF signals.

The front end system 243 aids in conditioning signals provided to and/or received from the antennas 244. In the illustrated embodiment, the front end system 243 includes antenna tuning circuitry 250, power amplifiers (PAs) 251, low noise amplifiers (LNAs) 252, filters 253, switches 254, and signal splitting/combining circuitry 255. However, other implementations are possible. The filters 253 can include one or more switchable acoustic wave filters in accordance with any suitable principles and advantages disclosed herein.

The front end system 243 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 240 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 244 can include antennas used for a wide variety of types of communications. For example, the antennas 244 can include antennas for transmitting and/or receiving signals associated with a wide variety of frequencies and communications standards.

In certain implementations, the antennas 244 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 240 can operate with beamforming in certain implementations. For example, the front end system 243 can include amplifiers having controllable gain and phase shifters having controllable phase to provide beam formation and directivity for transmission and/or reception of signals using the antennas 244. For example, in the context of signal transmission, the amplitude and phases of the transmit signals provided to the antennas 244 are controlled such that radiated signals from the antennas 244 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 244 from a particular direction. In certain implementations, the antennas 244 include one or more arrays of antenna elements to enhance beamforming.

The baseband system 241 is coupled to the user interface 247 to facilitate processing of various user input and output (I/O), such as voice and data. The baseband system 241 provides the transceiver 242 with digital representations of transmit signals, which the transceiver 242 processes to generate RF signals for transmission. The baseband system 241 also processes digital representations of received signals provided by the transceiver 242. As shown in FIG. 24, the baseband system 241 is coupled to the memory 246 of facilitate operation of the wireless communication device 240.

The memory 246 can be used for a wide variety of purposes, such as storing data and/or instructions to facilitate the operation of the wireless communication device 240 and/or to provide storage of user information.

The power management system 245 provides a number of power management functions of the wireless communication device 240. In certain implementations, the power management system 245 includes a PA supply control circuit that controls the supply voltages of the power amplifiers 251. For example, the power management system 245 can be configured to change the supply voltage(s) provided to one or more of the power amplifiers 251 to improve efficiency, such as power added efficiency (PAE).

As shown in FIG. 24, the power management system 245 receives a battery voltage from the battery 248. The battery 248 can be any suitable battery for use in the wireless communication device 240, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz or in a frequency range from about 400 MHz to 5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above,"

"below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A switchable acoustic wave filter comprising:
    a first acoustic wave resonator;
    a second acoustic wave resonator; and
    a switch configured to electrically connect the first acoustic wave resonator to a node of the switchable acoustic wave filter in a first state and to electrically isolate the first acoustic wave resonator from the node of the switchable acoustic wave filter in a second state, the switch configured to electrically connect an electrode of the first acoustic wave resonator to a passive impedance element in the second state such that the passive impedance element is in parallel with the first acoustic wave resonator in the second state; the switchable acoustic wave filter configured to receive a radio frequency signal, filter the radio frequency signal with at least the first acoustic wave resonator and the second acoustic wave resonator in the first state, and filter the radio frequency signal with at least the second acoustic wave resonator in the second state.

2. The switchable acoustic wave filter of claim 1 further comprising a third acoustic wave resonator, the switch configured to electrically isolate the third acoustic wave resonator from the node in the first state and electrically connect the third acoustic wave resonator to the node in the second state.

3. The switchable acoustic wave filter of claim 2 wherein the first acoustic wave resonator and the third acoustic wave resonator have different resonant frequencies.

4. The switchable acoustic wave filter of claim 1 wherein the switchable acoustic wave filter has a different bandwidth in the first state than in the second state.

5. The switchable acoustic wave filter of claim 1 wherein the first acoustic wave resonator is a series resonator.

6. The switchable acoustic wave filter of claim 1 wherein the first acoustic wave resonator is a shunt resonator.

7. The switchable acoustic wave filter of claim 1 wherein the first acoustic wave resonator is a bulk acoustic wave resonator.

8. The switchable acoustic wave filter of claim 1 wherein the switchable acoustic wave filter is a band pass filter.

9. The switchable acoustic wave filter of claim 1 wherein the switchable acoustic wave filter is a band stop filter.

10. The switchable acoustic wave filter of claim 1 wherein the switchable acoustic wave filter has a single switch loss.

11. The switchable acoustic wave filter of claim 1 further comprising a second switch and a fourth acoustic wave resonator, the second switch configured to electrically connect and electrically isolate the fourth acoustic wave resonator from a second node of the switchable acoustic wave filter in different states.

12. The switchable acoustic wave filter of claim 1 wherein the passive impedance element is a resistor.

13. The switchable acoustic wave filter of claim 1 wherein the switchable acoustic wave filter is configured to filter a wireless local area network signal.

14. The switchable acoustic wave filter of claim 1 wherein the switchable acoustic wave filter is configured to filter a cellular signal.

15. A multiplexer comprising:
    a switchable acoustic wave filter including a first acoustic wave resonator, a second acoustic wave resonator, and a switch configured to electrically connect the first acoustic wave resonator to a node of the switchable acoustic wave filter in a first state and to electrically isolate the first acoustic wave resonator from the node of the switchable acoustic wave filter in a second state for co-existence; the switchable acoustic wave filter configured to receive a radio frequency signal, filter the radio frequency signal with at least the first acoustic wave resonator and the second acoustic wave resonator in the first state, and filter the radio frequency signal with at least the second acoustic wave resonator in the second state for co-existence; the switchable acoustic wave filter being a band pass filter having a pass band; and; and
    a second filter coupled to the switchable acoustic wave filter at a common node, the second filter being a band stop filter having a stop band, and an edge of the pass band of the switchable acoustic wave filter being farther from an edge of the stop band of the second filter in the second state for co-existence than in the first state.

16. The multiplexer of claim 15 wherein the second filter is a second switchable acoustic wave filter configured to selectively electrically couple an acoustic wave resonator to a node of the second filter.

17. The multiplexer of claim 15 wherein the switch is configured to electrically connect a passive impedance element in parallel with the first acoustic wave resonator in the second state for co-existence.

18. The multiplexer of claim 15 wherein the stop band is associated with an operating band, and the pass band is associated with the operating band.

19. A method of radio frequency filtering, the method comprising:
    filtering a radio frequency signal with at least a first acoustic wave resonator and a second acoustic wave resonator of a switchable acoustic wave filter in a first state, the switchable acoustic wave filter being a band pass filter having a pass band;
    a toggling a state of the switchable acoustic wave filter from the first state to a second state; and filtering a radio frequency signal with at least the second acoustic wave resonator of the switchable acoustic wave filter and not with the first acoustic wave resonator in the second state, the pass band of the band pass filter having an edge that is farther from an edge of a stop band of a band stop filter in the second state than in the first state, the band pass filter and the band stop filter being included in a multiplexer and being connected to each other at a common node.

20. The method of claim 19 wherein the switchable acoustic wave filter electrically connects a passive impedance element in parallel with the first acoustic wave resonator in the second state.

* * * * *